US012740250B2

(12) United States Patent
Jang et al.

(10) Patent No.: US 12,740,250 B2
(45) Date of Patent: Sep. 15, 2026

(54) DISPLAY PANEL

(71) Applicant: Samsung Display Co., Ltd., Yongin-si (KR)

(72) Inventors: Kyeongwoo Jang, Yongin-si (KR); Sungho Kim, Yongin-si (KR); Sewan Son, Yongin-si (KR); Minwoo Woo, Yongin-si (KR); Kwanhee Lee, Yongin-si (KR); Seunghyun Lee, Yongin-si (KR); Wangwoo Lee, Yongin-si (KR); Jiseon Lee, Yongin-si (KR); Sugwoo Jung, Yongin-si (KR); Hyeri Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 518 days.

(21) Appl. No.: 18/475,379

(22) Filed: Sep. 27, 2023

(65) Prior Publication Data

US 2024/0172485 A1 May 23, 2024

(30) Foreign Application Priority Data

Nov. 23, 2022 (KR) ........................ 10-2022-0158532

(51) Int. Cl.

*H10K 59/122* (2023.01)
*H10K 59/80* (2023.01)
*H10K 59/88* (2023.01)

(52) U.S. Cl.

CPC ......... *H10K 59/122* (2023.02); *H10K 59/873* (2023.02); *H10K 59/88* (2023.02)

(58) Field of Classification Search

CPC ..... H10K 59/122; H10K 59/873; H10K 59/88
See application file for complete search history.

(56) References Cited

U.S. PATENT DOCUMENTS

| | | | |
|---|---|---|---|
| 10,910,590 B2 | 2/2021 | Harikrishna Mohan et al. | |
| 11,569,320 B2 | 1/2023 | You | |
| 2021/0126060 A1* | 4/2021 | Koo | H10K 59/65 |
| 2021/0242423 A1 | 8/2021 | Lee | |
| 2022/0077243 A1 | 3/2022 | You | |

(Continued)

FOREIGN PATENT DOCUMENTS

| | | |
|---|---|---|
| KR | 10-2021-0099246 | 8/2021 |
| KR | 10-2021-0134172 | 11/2021 |
| KR | 10-2022-0031836 | 3/2022 |

*Primary Examiner* — Fatima N Farokhrooz
(74) *Attorney, Agent, or Firm* — F. CHAU & ASSOCIATES, LLC

(57) ABSTRACT

A display panel includes a substrate including a display area and a non-display area disposed outside the display area, first to third light-emitting diodes disposed on a substrate in the display area, a metal bank layer disposed in the display area and having pixel openings, a first inorganic encapsulation layer disposed on the first light-emitting diode, a first dummy layer disposed between the first inorganic encapsulation layer and the metal bank layer, a first clad layer overlapping an end of the first dummy layer, and a dam disposed on the non-display area and including a first inorganic layer and a second inorganic layer on the first inorganic layer, wherein the first inorganic layer and the first inorganic encapsulation layer include a same material, and the second inorganic layer and the first clad layer include a same material.

23 Claims, 27 Drawing Sheets

(56) References Cited

U.S. PATENT DOCUMENTS

| | | | | |
|---|---|---|---|---|
| 2023/0010053 | A1* | 1/2023 | Nishimura | H10K 59/122 |
| 2024/0081130 | A1* | 3/2024 | Hanari | H10K 59/873 |
| 2024/0090300 | A1* | 3/2024 | Hanari | H10K 59/871 |

* cited by examiner

CM
IV'
225
PC3
212'
223
DA
PC2
PT
OP1
221
PC1
IV
217
BNL
215
213
212
211
209
207
205
203
201
100
Z

FIG. 11A

CM
225
223
251P
241P
231P
DM1
OP1
251
241
231
221
ED1
311
217
215
BNL
213
212
211
209
207
205
203
201
100
PC1
PC2
PC3
DA
IV
IV'
Z

FIG. 12A

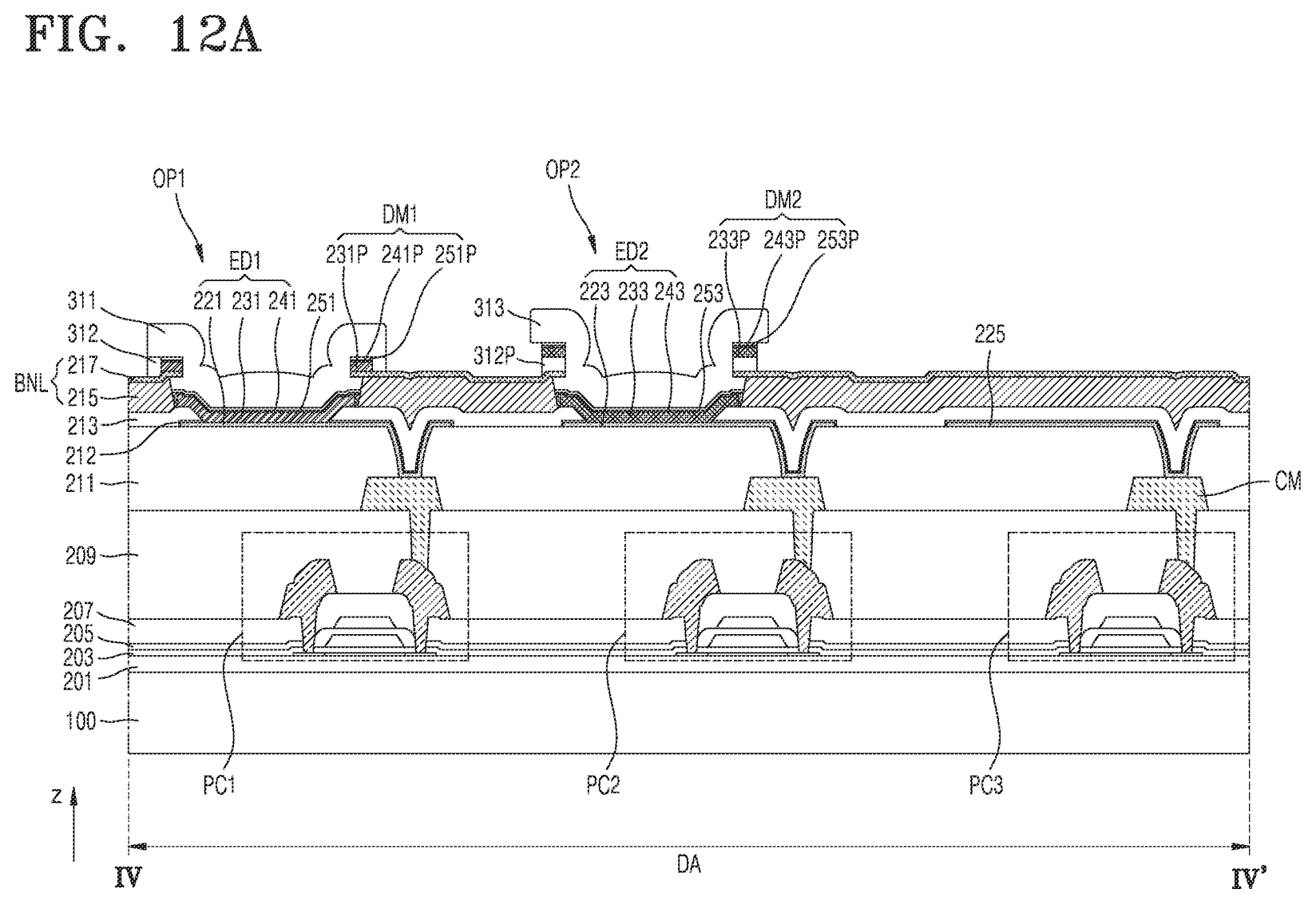

CM
IV'
225
DM2
233P 243P 253P
253
ED2
223 233 243
OP2
313
312P
PC3
PC2
DA
DM1
231P 241P 251P
251
ED1
221 231 241
OP1
311
312
217
215
BNL
213
212
211
209
207
205
203
201
100
PC1
IV
Z

FIG. 13A

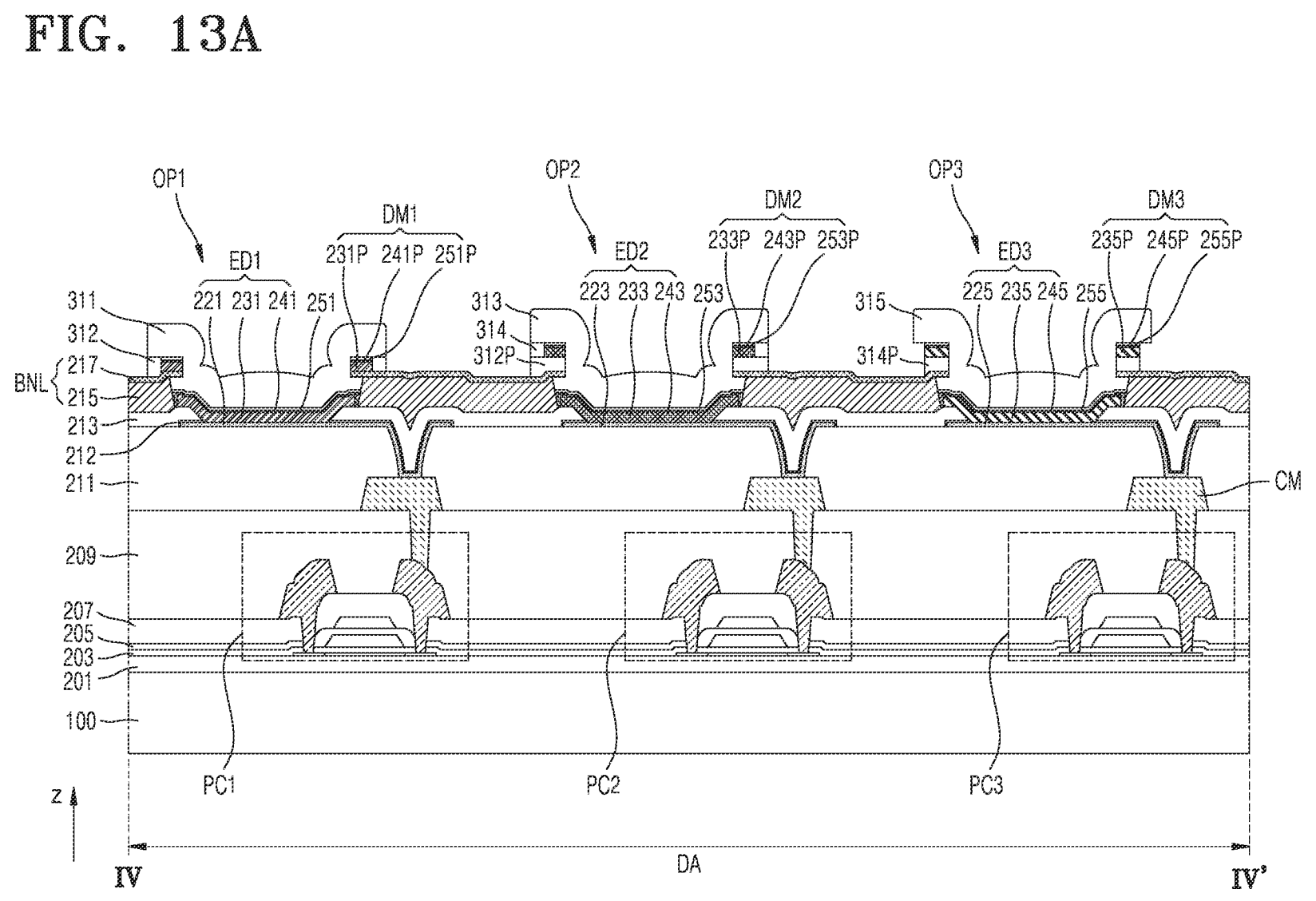

OP1 OP2 OP3
ED1 221 231 241 251
DM1 231P 241P 251P
ED2 223 233 243 253
DM2 233P 243P 253P
ED3 225 235 245 255
DM3 235P 245P 255P
CM
311 312 313 314 312P 315 314P
BNL 217 215 213 212 211 209 207 205 203 201 100
PC1 PC2 PC3
DA
IV IV'
Z

FIG. 13B

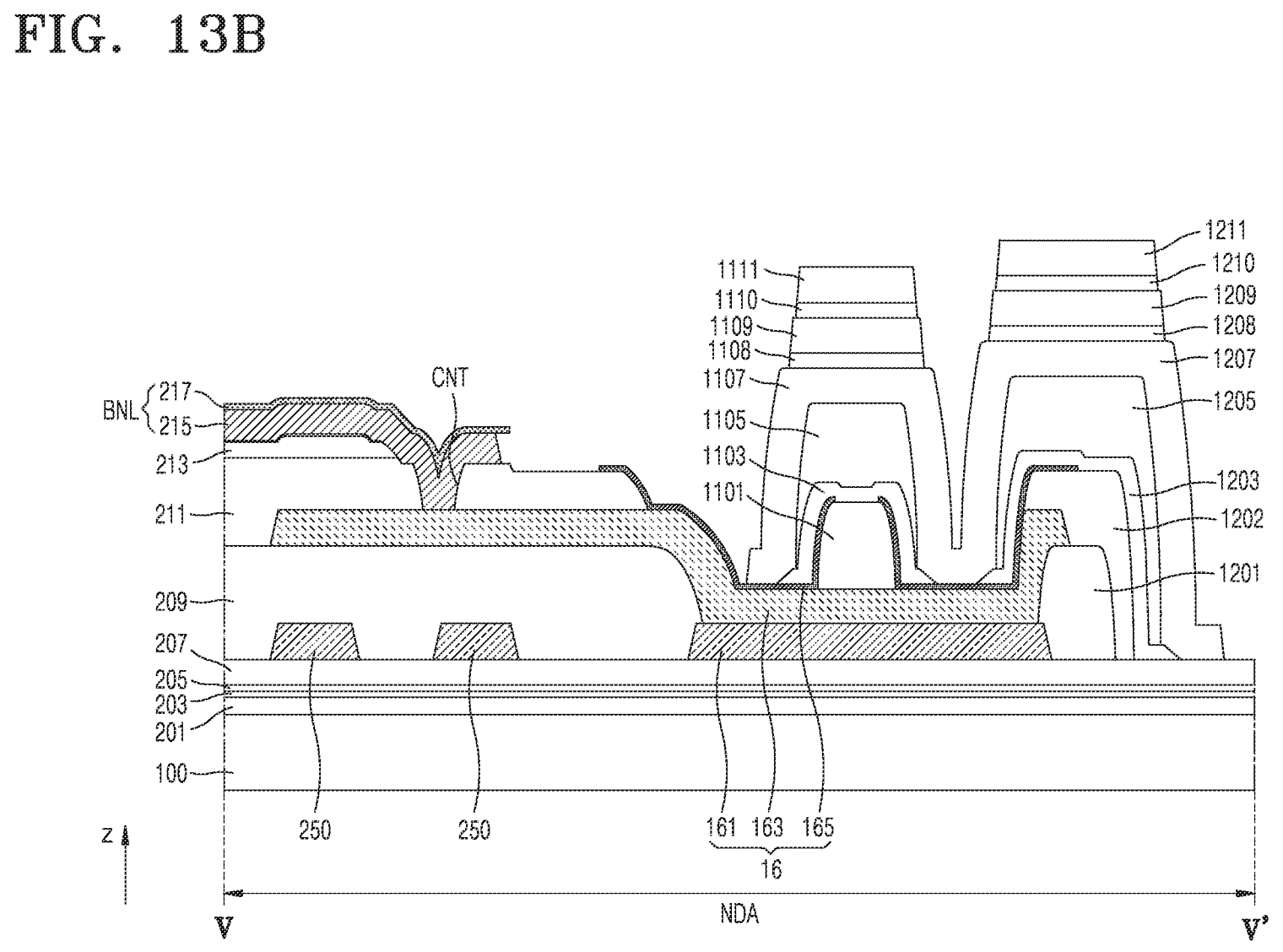

BNL
217
215
213
211
209
207
205
203
201
100
250
250
CNT
161
163
165
16
NDA
V
V'
1111
1110
1109
1108
1107
1105
1103
1101
1211
1210
1209
1208
1207
1205
1203
1202
1201
z

FIG. 14A

DAM2
IL2
1212
1211
1210
1209
1208
1207
1205
1203
1202
1201
V'
DAM1
IL1
1112
1111
1110
1109
1108
1107
1105
1103
1101
165
163
161
16
NDA
CNT
250
250
BNL
217
215
213
211
209
207
205
203
201
100
V
Z

FIG. 16

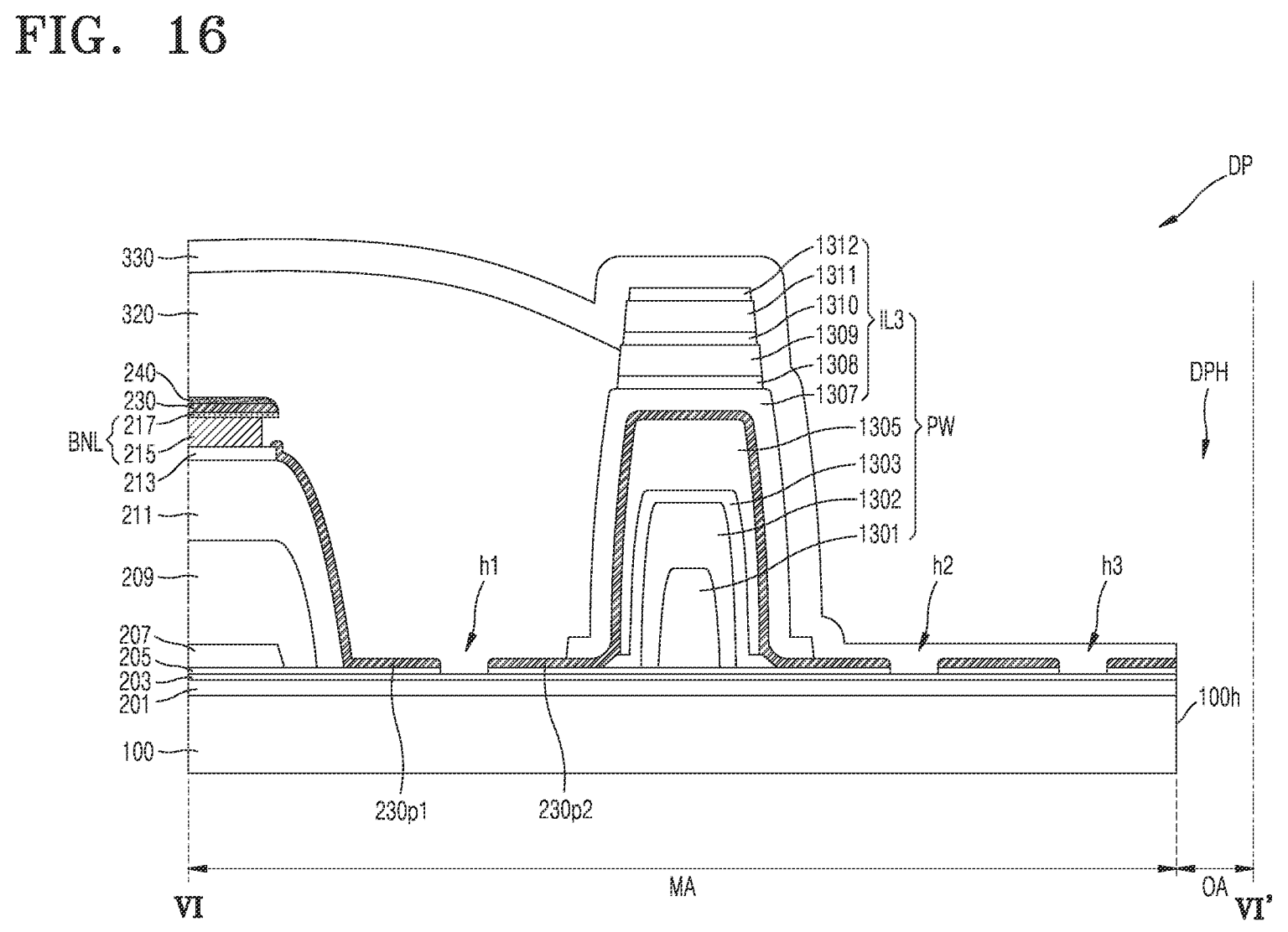

DP
DPH
VI'
OA
100h
h3
h2
h1
PW
IL3
1312
1311
1310
1309
1308
1307
1305
1303
1302
1301
230p2
230p1
MA
330
320
240
230
217
215
213
211
209
207
205
203
201
100
BNL
VI

DISPLAY PANEL

CROSS-REFERENCE TO RELATED APPLICATION(S)

This application claims priority to and benefits of Korean Patent Application No. 10-2022-0158532 under 35 U.S.C. § 119, filed on Nov. 23, 2022 in the Korean Intellectual Property Office, the entire contents of which are incorporated herein by reference.

BACKGROUND

1. Technical Field

One or more embodiments relate to a display panel.

2. Description of the Related Art

Recently, the use of display devices has diversified. Furthermore, as the thickness and weight of display devices have been reduced, the scope of use thereof has expanded.

Generally, to display an image, a display device may include pixels that receive an electrical signal and emit light. The pixels of an organic light-emitting display device (OLED) each include an organic light-emitting diode as a display element. An organic light-emitting diode may include a pixel electrode, an emission layer, and an opposite electrode.

Such a display device may be provided with an encapsulation layer for sealing a light-emitting diode so that external oxygen and moisture do not permeate into the light-emitting diode.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments provide a display panel with improved reliability by reducing the permeation of oxygen or moisture from the outside. However, the one or more embodiments are just examples, and the scope of the disclosure is not limited thereby.

Additional aspects will be set forth in part in the description which follows and, in part, will be apparent from the description, or may be learned by practice of the embodiments of the disclosure.

According to one or more embodiments, a display panel may include a display area, a non-display area disposed outside the display area, first to third light-emitting diodes disposed on a substrate in the display area and emitting light in different colors, the first to third light-emitting diodes each including a pixel electrode, an opposite electrode disposed to correspond to the pixel electrode, and an intermediate layer disposed between the pixel electrode and the opposite electrode, a metal bank layer disposed in the display area and having pixel openings corresponding to the pixel electrode of the first light-emitting diode, the pixel electrode of the second light-emitting diode, and the pixel electrode of the third light-emitting diode, a first inorganic encapsulation layer disposed on the first light-emitting diode, a first dummy layer disposed between the first inorganic encapsulation layer and the metal bank layer, a first clad layer overlapping an end of the first dummy layer, and a dam disposed in the non-display area to surround at least a portion of the display area and including a first inorganic layer and a second inorganic layer on the first inorganic layer. The first inorganic layer and the first inorganic encapsulation layer may include a same material, and the second inorganic layer and the first clad layer may include a same material.

The metal bank layer may include a first sub-metal layer and a second sub-metal layer that are disposed on the first sub-metal layer. The second sub-metal layer may have tips each extending from an upper surface of the first sub-metal layer toward a center of each of the pixel openings.

Each of the opposite electrode of the first light-emitting diode, the opposite electrode of the second light-emitting diode, and the opposite electrode of the third light-emitting diode may directly contact the second sub-metal layer.

The second inorganic layer may be disposed to correspond to an upper surface of the first inorganic layer.

The display panel may further include an inorganic bank layer disposed below the metal bank layer and having openings corresponding to the pixel electrode of the first light-emitting diode, the pixel electrode of the second light-emitting diode, and the pixel electrode of the third light-emitting diode. The dam may further include a lower inorganic layer disposed below the first inorganic layer, and the lower inorganic layer and the inorganic bank layer may include a same material.

The dam may further include an organic layer disposed between the lower inorganic layer and the first inorganic layer.

The first inorganic layer may directly contact the lower inorganic layer.

The dam may further include a metal layer disposed below the first inorganic layer. The metal layer and the metal bank layer may include a same material.

The display panel may further include a second inorganic encapsulation layer disposed on the second light-emitting diode, a second dummy layer disposed between the second inorganic encapsulation layer and the metal bank layer, and a second clad layer overlapping an end of the second dummy layer. The dam may further include a third inorganic layer and a fourth inorganic layer sequentially stacked on each other on the second inorganic layer. The third inorganic layer and the second inorganic encapsulation layer may include a same material, and a fourth inorganic layer and the second clad layer may include a same material.

The display panel may further include a third inorganic encapsulation layer disposed on the third light-emitting diode, a third dummy layer disposed between the third inorganic encapsulation layer and the metal bank layer, and a third clad layer overlapping an end of the third dummy layer. The dam may further include a fifth inorganic layer and a sixth inorganic layer sequentially stacked on each other on the fourth inorganic layer. The fifth inorganic layer and the third inorganic encapsulation layer may include a same material, and the sixth inorganic layer and the third clad layer may include a same material.

The display panel may further include an organic encapsulation layer disposed on the first inorganic encapsulation layer. The dam may include a first dam and a second dam apart from the first dam and disposed outside the first dam. The end of the organic encapsulation layer may be disposed on a side surface or an upper surface of the first dam.

The display panel may further include a common voltage supply line disposed on the non-display area and surrounding at least a portion of the display area. The metal bank layer may directly contact the common voltage supply line.

An outer end of the common voltage supply line and the second dam may overlap each other.

According to one or more embodiments, a display panel may include an opening area, a display area surrounding the opening area, a middle area disposed between the opening area and the display area, first to third light-emitting diodes disposed on a substrate in the display area and emitting light in different colors, the first to third light-emitting diodes each including a pixel electrode, an opposite electrode disposed to correspond to the pixel electrode, and an intermediate layer disposed between the pixel electrode and the opposite electrode, a metal bank layer disposed in the display area and having pixel openings corresponding to the pixel electrode of the first light-emitting diode, the pixel electrode of the second light-emitting diode, and the pixel electrode of the third light-emitting diode, a first inorganic encapsulation layer disposed on the first light-emitting diode, a first dummy layer disposed between the first inorganic encapsulation layer and the metal bank layer, a first clad layer overlapping an end of the first dummy layer, and a barrier rib disposed on the middle area to surround the opening area and including a first inorganic barrier layer and a second inorganic barrier layer on the first inorganic barrier layer. The first inorganic barrier layer and the first inorganic encapsulation layer may include a same material, and the second inorganic barrier layer and the first clad layer may include a same material.

The display panel may further include an inorganic bank layer disposed below the metal bank layer and having openings corresponding to the pixel electrode of the first light-emitting diode, the pixel electrode of the second light-emitting diode, and the pixel electrode of the third light-emitting diode. The barrier rib may further include a lower inorganic barrier layer disposed below the first inorganic barrier layer. The lower inorganic barrier layer and the inorganic bank layer may include a same material.

The first inorganic barrier layer may directly contact the lower inorganic barrier layer.

The barrier rib may further include a metal barrier layer disposed below the first inorganic barrier layer. The metal barrier layer and the metal bank layer may include a same material.

The display panel may further include a second inorganic encapsulation layer disposed on the second light-emitting diode, a second dummy layer disposed between the second inorganic encapsulation layer and the metal bank layer, and a second clad layer overlapping an end of the second dummy layer. The barrier rib may further include a third inorganic barrier layer and a fourth inorganic barrier layer sequentially stacked on each other on the second inorganic barrier layer. The third inorganic barrier layer and the second inorganic encapsulation layer may include a same material, and the fourth inorganic barrier layer and the second clad layer may include a same material.

The display panel may further include a third inorganic encapsulation layer disposed on the third light-emitting diode, a third dummy layer disposed between the third inorganic encapsulation layer and the metal bank layer, and a third clad layer overlapping an end of the third dummy layer. The barrier rib may further include a fifth inorganic barrier layer and a sixth inorganic barrier layer sequentially stacked on each other on the fourth inorganic barrier layer. The fifth inorganic barrier layer and the third inorganic encapsulation layer may include a same material. The sixth inorganic barrier layer and the third clad layer may include a same material.

The display panel may further include a separator disposed in the middle area and including a first layer and a second layer on the first layer. The second layer may have tips extending from an upper surface of the first layer toward the display area and the opening area.

The metal bank layer may include a first sub-metal layer and a second sub-metal layer disposed on the first sub-metal layer. The second sub-metal layer may have tips each extending from an upper surface of the first sub-metal layer toward a center of each of the pixel openings.

The first layer of the separator and the first sub-metal layer may include a same material, and the second layer of the separator and the second sub-metal layer may include a same material.

A thickness of the first layer of the separator may be equal to a thickness of the first sub-metal layer, and a thickness of the second layer of the separator may be equal to a thickness of the second sub-metal layer.

Other aspects, features, and advantages than those described above will become apparent from the following drawings, claims, and detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 7A and 7B are schematic cross-sectional views of a portion of a display panel according to an embodiment;

FIGS. 10A to 14B are schematic cross-sectional views illustrating some steps in a process of manufacturing a display panel according to an embodiment; and FIGS. 15 to 17 are schematic cross-sectional views of a portion of a display panel according to embodiments.

DETAILED DESCRIPTION OF THE EMBODIMENTS

Figure 1:
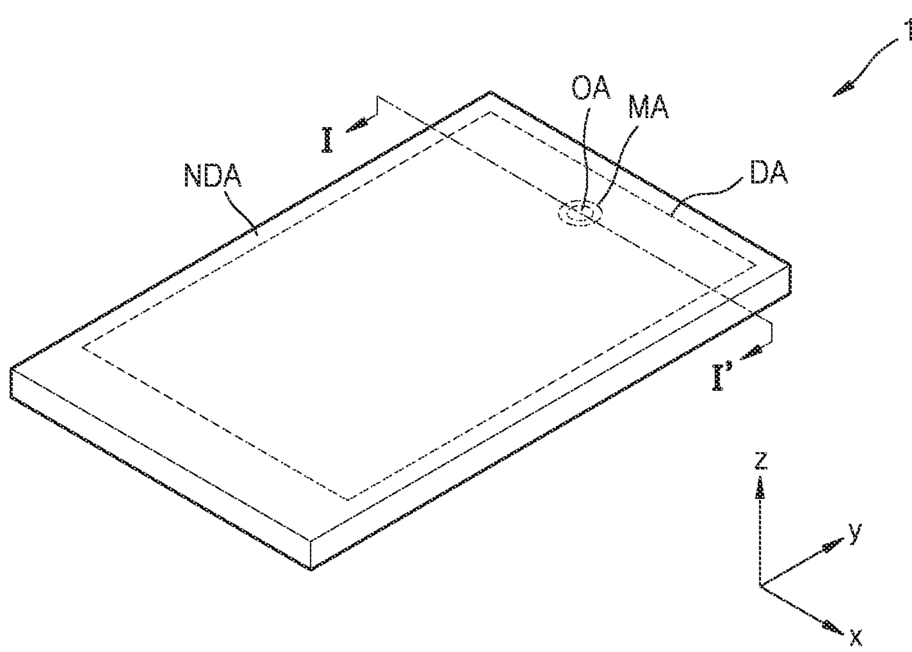
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the singular forms, “a,” “an,” and “the” are intended to include the plural forms as well, unless the context clearly indicates otherwise.

In the specification and the claims, the term “and/or” is intended to include any combination of the terms “and” and “or” for the purpose of its meaning and interpretation. For example, “A and/or B” may be understood to mean any combination including “A, B, or A and B.” The terms “and” and “or” may be used in the conjunctive or disjunctive sense and may be understood to be equivalent to “and/or.”

In the specification and the claims, the phrase “at least one of” is intended to include the meaning of “at least one selected from the group of” for the purpose of its meaning and interpretation. For example, “at least one of A and B” may be understood to mean any combination including “A, B, or A and B.”

It will be understood that although the terms “first,” “second,” etc. may be used herein to describe various components, these components should not be limited by these terms. These terms are only used to distinguish one component from another.

The terms “comprises,” “comprising,” “includes,” and/or “including,”, “has,” “have,” and/or “having,” and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the following embodiments, it will be understood that when a layer, region, or component is referred to as being “formed on” or “on” another layer, region, or component, it can be directly or indirectly on the other layer, region, or component. That is, for example, intervening layers, regions, or components may be present.

It will be understood that when a layer, region, or component is referred to as being “connected to” another layer, region, or component, it can be directly connected to the other layer, region, or component or indirectly connected to the other layer, region, or component via intervening layers, regions, or components.

It will be understood that the terms “connected to” or “coupled to” may include a physical and/or electrical connection or coupling.

The terms “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art.

The x-axis, the y-axis and the z-axis may not be limited to three axes of the rectangular coordinate system, and may be interpreted in a broader sense. For example, the x-axis, the y-axis, and the z-axis may be perpendicular to one another, or may represent different directions that are not perpendicular to one another.

The spatially relative terms “below”, “beneath”, “lower”, “above”, “upper”, or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned “below” or “beneath” another device may be placed “above” another device. Accordingly, the illustrative term “below” may include both the lower and upper positions. The device may also be oriented in other directions and thus the spatially relative terms may be interpreted differently depending on the orientations.

When a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. For example, since sizes and thicknesses of components in the drawings are arbitrarily illustrated for convenience of explanation, the following embodiments are not limited thereto.

“About” or “approximately” or “substantially” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display 1 device according to an embodiment.

Referring to FIG. 1, the display device 1 may be a device for displaying a moving image or still image, and may be used as a display screen for various products including not only portable electronic devices, such as mobile phones, smart phones, tablet personal computers (PCs), mobile communication terminals, electronic organizers, electronic books, portable multimedia players (PMPs), navigation devices, ultra-mobile PCs (UMPCs), and the like, but also televisions, notebook computers, monitors, billboards, internet of things (IOT) devices, and the like. Furthermore, the display device 1 according to an embodiment may be used in wearable devices, such as smart watches, watch phones, glasses type displays, and head mounted displays (HMDs). Furthermore, the display device 1 according to an embodiment may be applied to an instrument panel of a vehicle, and a center information display (CID) arranged in a center fascia or dashboard of a vehicle, a room mirror display in lieu of a side mirror of a vehicle, and a display screen arranged on the backside of the front seat as an entertainment for the rear seat of a vehicle. The display device 1 may be bendable, foldable, and/or rollable. FIG. 1 shows that the display device 1 according to an embodiment is used as a smart phone for convenience of description.

The display device 1 may have a rectangular shape in a plan view. For example, the display device 1 may have a rectangular planar shape having a short side in an x direction and a long side in a y direction, as shown in FIG. 1. A corner where the short side in the x direction and the long side in the y direction meet may be round to have a certain curvature or may be formed at a right angle. The planar shape of the display device 1 is not limited to a rectangular shape, and may be other polygonal, elliptical, or atypical shapes.

The display device 1 may include an opening area (or first area) OA and a display area (or second area) DA at least partially surrounding the opening area OA. The display device 1 may include a middle area MA between the opening area OA and the display area DA, and a non-display area NDA surrounding the outside of the display area DA. The middle area MA and the non-display area NDA may each be an area in which no image is displayed because pixels may not be disposed therein.

The opening area OA may be located (disposed) inside the display area DA. As an example, the opening area OA may be located at the upper center of the display area DA, as shown in FIG. 1. In another embodiment, the opening area OA may be located in various positions, such as the upper left side or the upper right side of the display area DA. "Left", "right", "top", and "bottom" in a plan view indicate directions when the display device 1 is viewed in a direction perpendicular to the display device 1. For example, "left" indicates a −x direction, "right" indicates a +x direction, "top" indicates a +y direction, and "bottom" indicates a −y direction. Although FIG. 1 shows that one opening area OA is provided, in another embodiment, multiple opening areas OA may be provided.

Figure 2:
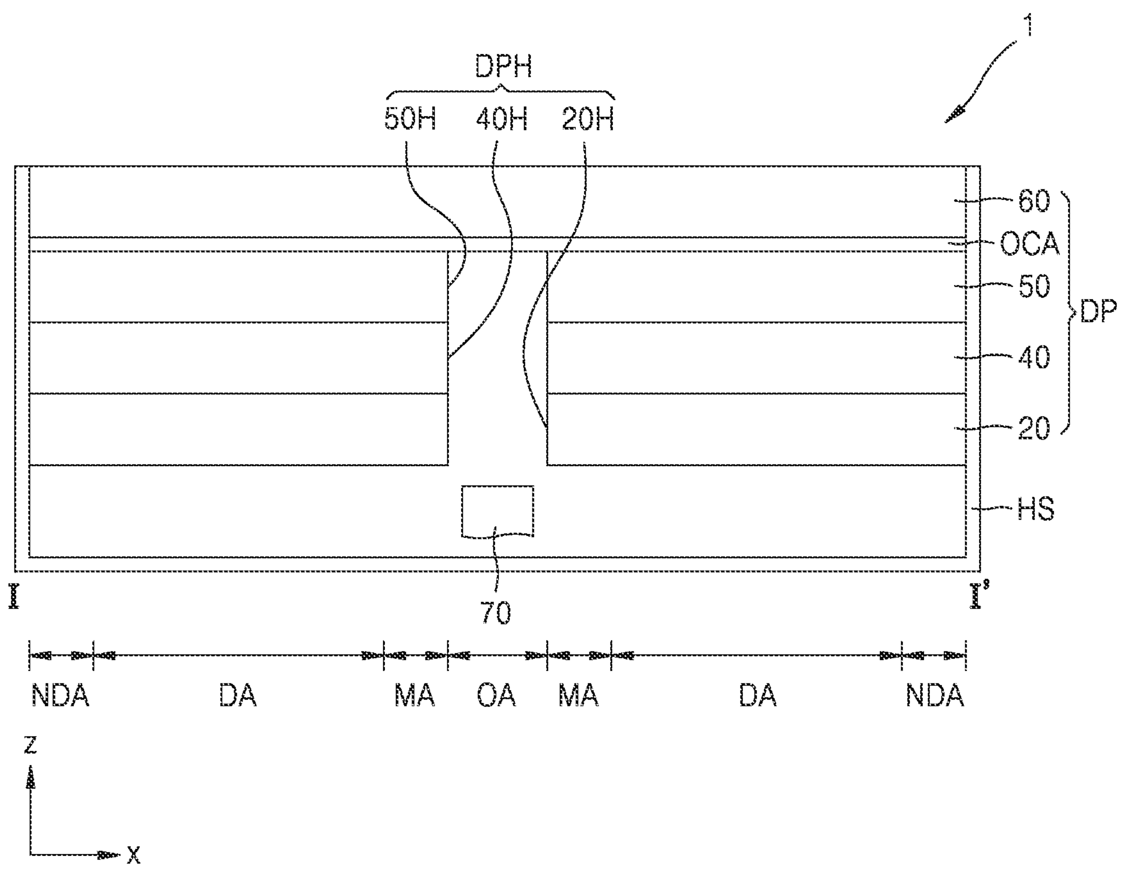
FIG. 2 is a schematic cross-sectional view of a display device according to an embodiment.

FIG. 2 is a schematic cross-sectional view of a display device 1 according to an embodiment. FIG. 2 shows a cross-section of the display device 1 taken along a line I-I'of FIG. 1.

Referring to FIG. 2, the display device 1 may include a display panel DP and a component 70 arranged in an opening area OA of the display panel DP. The display panel DP and the component 70 may be accommodated in a housing HS.

The display panel DP may include a display layer 20, an input sensing layer 40, an optical functional layer 50, and a cover window 60.

The display layer 20 may include display elements (or light-emitting elements) that emit light to display an image, and pixel circuits that are respectively connected to the display elements and apply electrical signals to the display elements. Each of the display elements may include a light-emitting diode, for example, an organic light-emitting diode including an organic emission layer.

The input sensing layer 40 may obtain coordinate information according to an external input, for example, a touch event. The input sensing layer 40 may include a sensing electrode (or touch electrode) and trace lines connected to the sensing electrode. The input sensing layer 40 may be disposed on the display layer 20. The input sensing layer 40 may sense an external input by using a mutual capacitance method and/or a self-capacitance method.

The input sensing layer 40 may be formed directly on the display layer 20 or formed separately and bonded thereto through an adhesive layer, such as an optically transparent adhesive. For example, the process of forming the input sensing layer 40 may be continuously performed after the process of forming the display layer 20, and, the adhesive layer may not be placed (disposed) between the input sensing layer 40 and the display layer 20. FIG. 2 shows that the input sensing layer 40 is placed between the display layer 20 and the optical functional layer 50. However, in another embodiment, the input sensing layer 40 may be disposed on the optical functional layer 50.

The optical functional layer 50 may include an antireflection layer. The antireflection layer may reduce the reflectance of light (external light) incident toward the display panel DP from the outside through the cover window 60. The antireflection layer may include a phase retarder and a polarizer. The phase retarder may be of a film type or a liquid crystal coating type. The polarizer may also be of a film type or a liquid crystal coating type. A polarizer of a film type may include a stretchable synthetic resin film, and a polarizer of a liquid crystal coating type may include liquid crystals arranged in a certain arrangement.

In another embodiment, the antireflection layer may include a black matrix and color filters. The color filters may be arranged by considering the color of light emitted from each of the light-emitting diodes of the display layer 20. In another embodiment, the antireflection layer may include a destructive interference structure. The destructive interference structure may include a first reflective layer and a second reflective layer disposed on different layers. First reflection light and second reflection light reflected from the first reflective layer and the second reflective layer, respectively, may cause destructive interference, and thus, external light reflectance may be reduced.

The optical functional layer 50 may include a lens layer. The lens layer may improve light emission efficiency of light emitted from the display layer 20 or reduce color deviation. The lens layer may include a layer having a concave or convex lens shape, and/or multiple layers having different refractive indices. The optical functional layer 50 may include both the antireflection layer and the lens layer, or any one of them.

The display panel DP may have an opening DPH. In this regard, FIG. 2 shows that the display layer 20, the input sensing layer 40, and the optical functional layer 50 have first to third openings 20H, 40H, and 50H, respectively, and the first to third openings 20H, 40H, and 50H overlap one another.

The first opening 20H may pass through the bottom surface of the display layer 20 from the top surface of the display layer 20, the second opening 40H may pass through the bottom surface of the input sensing layer 40 from the top surface of the input sensing layer 40, and the third opening 40H may pass through the bottom surface of the optical functional layer 50 from the top surface of the optical functional layer 50.

The first to third openings 20H, 40H, and 50H in the opening DPH of the display panel DP may be located to overlap one another in the opening area OA. The sizes (or diameters) of the first to third openings 20H, 40H, and 50H may be the same as or different from each other.

In another embodiment, at least one of the display layer 20, the input sensing layer 40, and the optical functional layer 50 may not have an opening. For example, one or two elements selected from among the display layer 20, the input sensing layer 40, and the optical functional layer 50 may not have an opening.

The cover window 60 may be disposed on the optical functional layer 50. The cover window 60 may be bonded to the optical functional layer 50 through an adhesive layer, such as optical clear adhesive (OCA) therebetween. The cover window 60 may include a glass material or a plastic material. For example, the cover window 60 may include an ultra-thin glass window. For example, the cover window 60 may include polyethersulfone, polyacrylate, polyether imide, polyethylene naphthalate, polyethylene terephthalate, polyphenylene sulfide, polyarylate, polyimide, polycarbonate, cellulose acetate propionate, and/or the like.

The opening area OA may be a type of component area (e.g., a sensor area, a camera area, or a speaker area) in which a component 70 for adding various functions to the display device 1 is located. The component 70 may be disposed under the display panel DP to overlap the opening DPH of the display panel DP.

The component 70 may include an electronic element. For example, the component 70 may be an electronic element using light or sound. For example, the electronic element may include a sensor that uses light, such as an infrared sensor, a camera that receives light and captures an image, a sensor that outputs and detects light or sound to measure distance or recognizes a fingerprint, a small lamp that outputs light, a speaker that outputs sound, and/or the like. Electronic elements using light may use light of various wavelength bands, such as visible light, infrared light, and ultraviolet light. The opening area OA may correspond to a transmission area through which light and/or sound may be outputted from the component 70 to the outside or may propagate inward from the outside toward the electronic element.

In another embodiment, in case that the display device 1 is used as a smart watch or a dashboard for a vehicle, the component 70 may be a member including clock hands or a needle indicating certain information (e.g., vehicle speed). The cover window 60 may include an opening positioned (disposed) in the opening area OA, unlike that shown in FIG. 2, so that the component 70 such as a needle may be exposed to the outside. In another embodiment, even in case that the display device 1 includes the component 70 such as a speaker, the cover window 60 may include an opening corresponding to the opening area OA.

Figure 3:
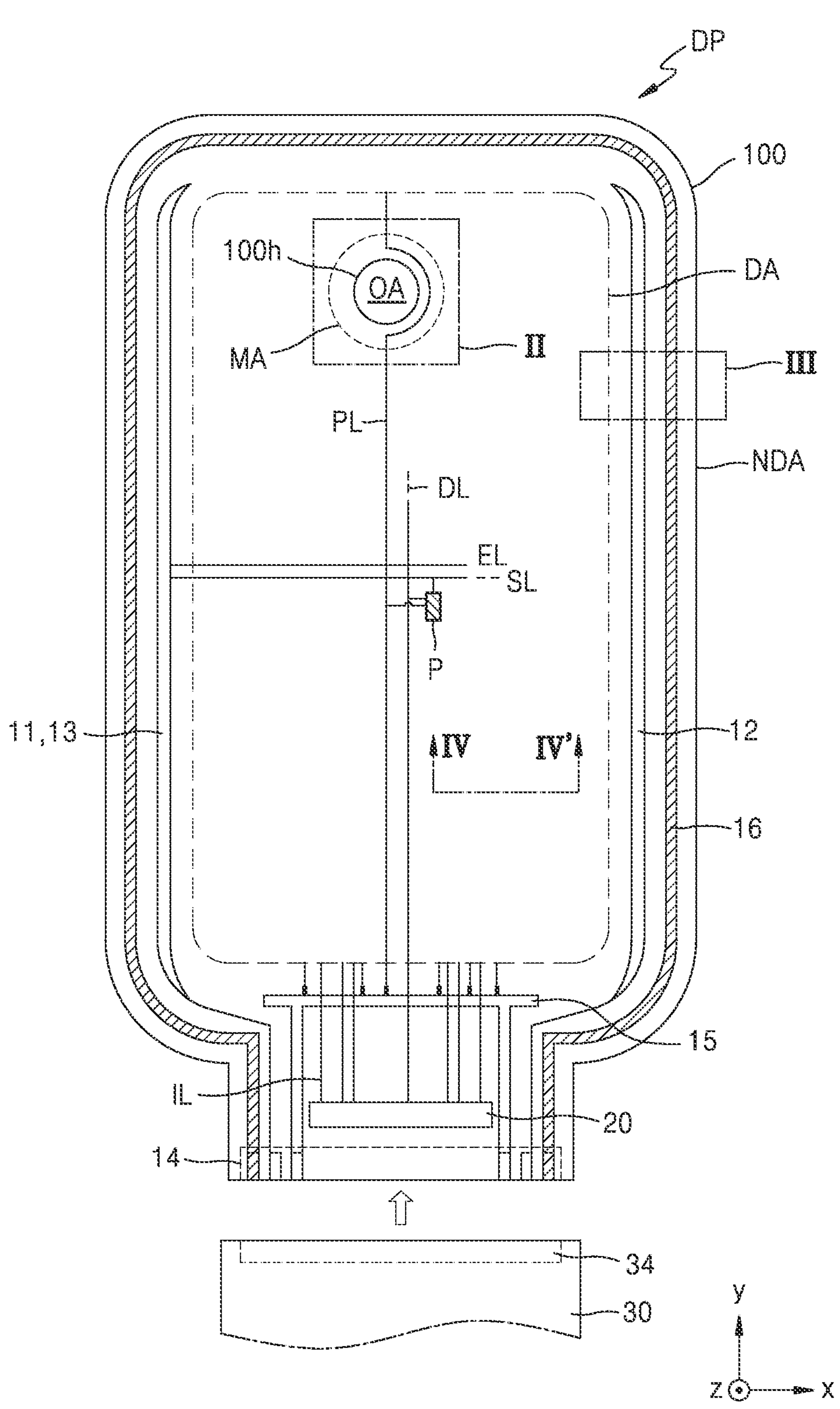
FIG. 3 is a schematic plan view of a display panel according to an embodiment.

FIG. 3 is a schematic plan view of a display panel DP according to an embodiment.

Referring to FIG. 3, the display panel DP may include an opening area OA, a display area DA surrounding at least a portion of the opening area OA, a middle are MA positioned between the opening area OA and the display area DA, and a non-display area NDA outside the display area DA.

The display panel DP may include a substrate 100. The fact that the display panel DP includes the opening area OA, the display area DA, the middle area MA, and the non-display area NDA may indicate that the substrate 100 includes the opening area OA, the display area DA, the middle area MA, and the non-display area NDA.

The opening area OA may be located inside the display area DA, and in relation to this, FIG. 3 shows that the opening area OA is located in the upper center of the display area DA. The opening area OA may be located in various positions, such as the upper left side or the upper right side of the display area DA, or may be provided in plural.

The substrate 100 may have a through hole 100H corresponding to the opening area OA. In the specification, the opening area OA may refer to the through hole 100H of the substrate 100.

The display area DA is an area for displaying an image, and multiple pixels P may be arranged in the display area DA. Although FIG. 3 shows that the display area DA has a substantially rectangular shape with round corners, the disclosure is not limited thereto. As described above, the display area DA may have various shapes, such as an N-gonal shape (N is a natural number of 3 or greater), a circular shape, or an elliptical shape.

Each of the pixels P refers to a sub-pixel and may include a display element, such as a light-emitting diode. The pixel P may emit, for example, red, green, blue, or white light.

The non-display area NDA may be located outside the display area DA. Outer circuits for driving the pixel P may be arranged in the non-display area NDA. For example, in the non-display area NDA, a first scan driving circuit 11, a second scan driving circuit 12, an emission control driving circuit 13, a terminal 14, a driving power supply line 15, and a common power supply line 16 may be arranged.

The first scan driving circuit 11 may provide a scan signal to the pixel P through a scan line SL. The second scan driving circuit 12 may be disposed parallel to the first scan driving circuit 11 with the display area DA therebetween. Some of the pixels P arranged in the display area DA may be electrically connected to the first scan driving circuit 11, and the rest may be connected to the second scan driving circuit 12. In another embodiment, the second scan driving circuit 12 may be omitted, and all of the pixels P arranged in the display area DA may be electrically connected to the first scan driving circuit 11.

The emission control driving circuit 13 may be disposed on the side of the first scan driving circuit 11 and may provide an emission control signal to the pixel P through an emission control line EL. Although FIG. 3 shows that the emission control driving circuit 13 is disposed on only one side of the display area DA, the emission control driving circuit 13 may be disposed on both sides of the display area DA, like the first scan driving circuit 11 and the second scan driving circuit 12.

A driving chip 20 may be arranged in the non-display area NDA. The driving chip 20 may include an integrated circuit that drives the display panel DP. The integrated circuit may be a data driving integrated circuit that generates a data signal, but the disclosure is not limited thereto.

The terminal 14 may be arranged in the non-display area NDA. The terminal 14 may be exposed without being covered by an insulating layer and electrically connected to a printed circuit board 30. A terminal 34 of the printed circuit board 30 may be electrically connected to the terminal 14 of the display panel DP.

The printed circuit board 30 may transmit a signal or power from a controller (not shown) to the display panel DP. A control signal generated by the controller may be transmitted to each of the driving circuits through the printed circuit board 30. The controller may transmit a driving voltage ELVDD (see FIG. 4) to the driving power supply line 15 and provide a common voltage ELVSS (see FIG. 4) to the common power supply line 16. The driving voltage ELVDD may be transmitted to each pixel P through a driving voltage line PL connected to the driving power supply line 15, and the common voltage ELVSS may be transmitted to an opposite electrode of the pixel P through a metal bank layer BNL (see FIG. 7A) connected to the common power supply line 16. The driving power supply line 15 may have a shape extending in a direction (e.g., an x direction) from the lower side of the display area DA. The common power supply line 16 may have a loop shape with a side open to partially surround the display area DA.

The controller may generate a data signal, and the generated data signal may be transmitted to an input line IL through the driving chip 20 and transmitted to the pixel P through the data line DL connected to the input line IL. For reference, "line" may refer to "wiring line". This may be the same in embodiments described below and modifications thereof.

Figure 4:
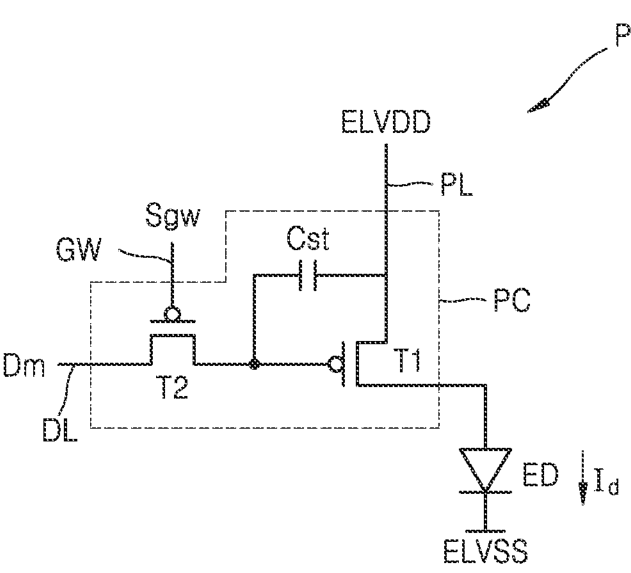
FIG. 4 is a schematic circuit diagram of an equivalent circuit of a pixel included in a display panel according to an embodiment.

FIG. 4 is a schematic diagram of an equivalent circuit of a pixel P included in a display panel according to an embodiment.

Referring to FIG. 4, the pixel P may include a light-emitting diode ED as a display element. The light-emitting diode ED may be electrically connected to a pixel circuit PC, and the pixel circuit PC may include a first transistor T1, a second transistor T2, and a storage capacitor Cst.

The second transistor T2 may be configured to send a data signal Dm input through a data line DL to the first transistor T1 in response to a scan signal Sgw input through a scan line GW.

The storage capacitor Cst may be connected to the second transistor T2 and a driving voltage line PL, and may store a voltage corresponding to a difference between a voltage received from the second transistor T2 and a driving voltage ELVDD supplied through the driving voltage line PL.

The first transistor T1 may be connected to the driving voltage line PL and the storage capacitor Cst, and may be configured to control a driving current Id flowing in the light-emitting diode ED from the driving voltage line PL, corresponding to a voltage value stored in the storage capacitor Cst. An opposite electrode (for example, a cathode) of the light-emitting diode ED may receive a common voltage ELVSS. The light-emitting diode ED may emit light having a certain luminance by the driving current Id.

Although FIG. 4 illustrates a case in which the pixel circuit PC includes two transistors and one storage capacitor, the disclosure is not limited thereto.

Figure 5:
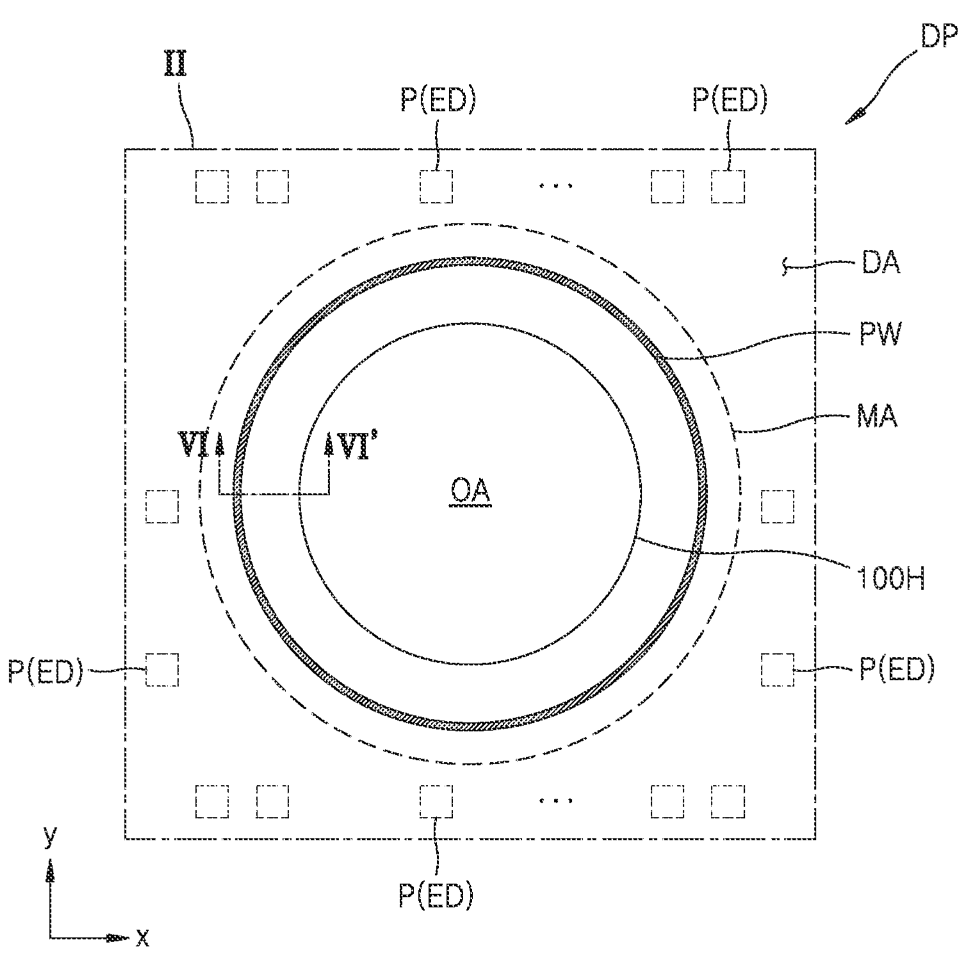
FIG. 5 is a schematic plan view of a portion of a display panel according to an embodiment.

FIG. 5 is a schematic plan view of a portion of a display panel DP according to an embodiment. FIG. 5 is an enlarged view of region II of the display panel DP shown in FIG. 3.

Multiple pixels P may be arranged in the display area DA, and the middle area MA may be located between the opening area OA and the display area DA. The pixels P may be arranged to surround the opening area OA and the middle area MA in the display area DA.

The position of each of the pixels P may correspond to the position of each of the light-emitting diodes ED. The fact that the pixel P is arranged in the display area DA may indicate that the light-emitting diode ED is arranged in the display area DA.

Pixels P adjacent to the opening area OA may be apart from each other around the opening area OA in a plan view. The pixels P may be vertically apart from each other around the opening area OA, or may be apart left and right around the opening area OA.

At least one barrier rib (referred to as a partition wall) PW may be arranged in the middle area MA. The barrier rib PW may have a closed-loop shape surrounding the opening area OA in a plan view. FIG. 5 shows that one barrier rib PW is located in the middle area MA, but in another embodiment, two or more barrier ribs PW may be apart from each other in the middle area MA.

Figure 7A:
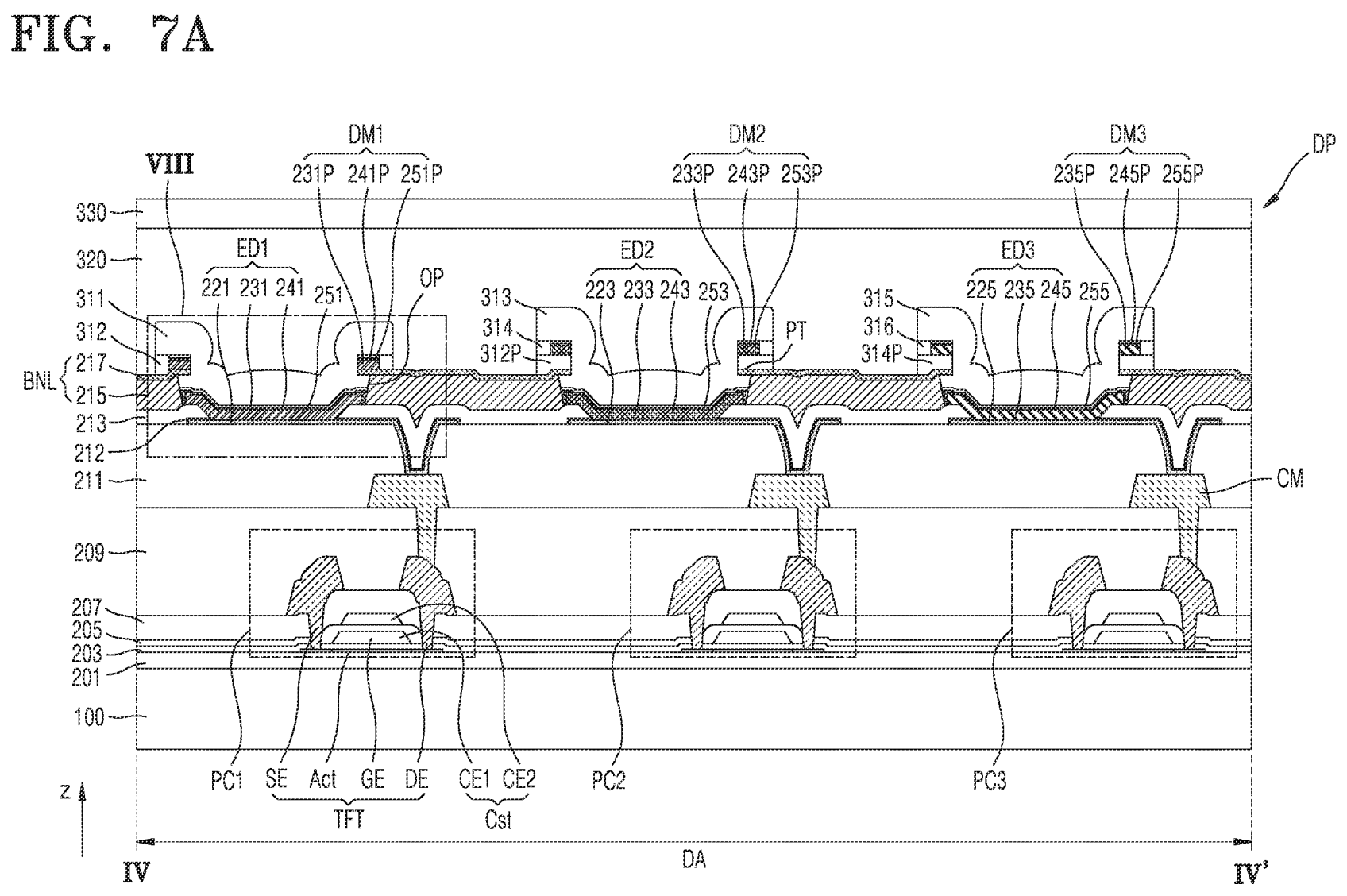

The barrier rib PW may control the flow of materials constituting an organic encapsulation layer 320 (see FIG. 7A). For example, the organic encapsulation layer 320 may be formed by applying a monomer on the display area DA through a process, such as inkjet, and curing the monomer, and the barrier rib PW may control the position of the organic encapsulation layer 320 by controlling the flow of the monomer.

Figure 6:
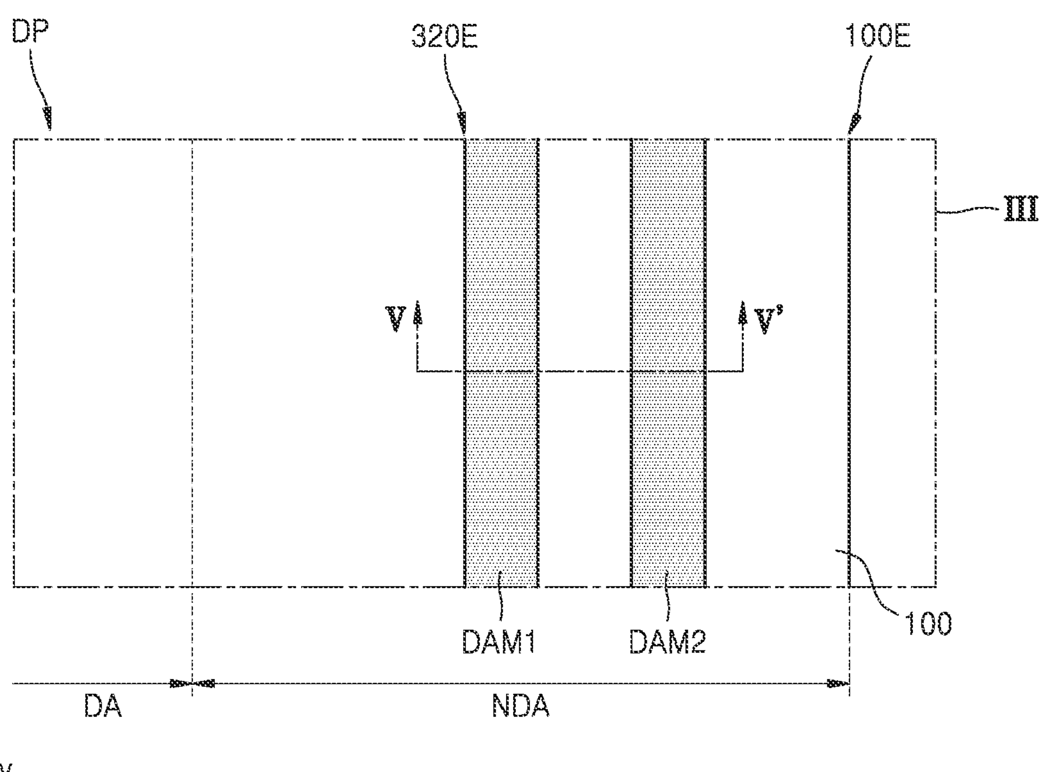
FIG. 6 is a schematic plan view of a portion of a display panel according to an embodiment.
Figure 6:
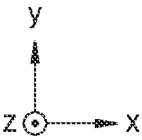

FIG. 6 is a schematic plan view of a portion of a display panel DP according to an embodiment. FIG. 6 is an enlarged view of region III of the display panel DP shown in FIG. 3.

Referring to FIG. 6, the display panel DP may include a display area DA and a non-display area NDA surrounding the display area DA. In the non-display area NDA, a first dam DAM1 and a second dam DAM2, which surround the display area DA, may be apart from each other.

The first dam DAM1 and the second dam DAM2 may control the flow of materials constituting the organic encapsulation layer 320 (see FIG. 7A). For example, in case that a monomer forming the organic encapsulation layer 320 is applied through a process such as inkjet, by controlling the flow of the monomer in a direction of an edge 100E of a substrate 100, formation of an edge tail by the organic encapsulation layer 320 at the edge 100E of the substrate 100 may be prevented. Accordingly, an end 320E of the organic encapsulation layer 320 may be located on the inner surface or upper surface of the first dam DAM1.

Although FIG. 6 shows that the first dam DAM1 and the second dam DAM2 are arranged in the non-display area NDA, in another embodiment, one or more sub-dams may be arranged inside the first dam DAM1. These sub-dams may reduce the flow rate of the monomer, thereby reducing the amount of the monomer passing through the first dam DAM1.

Figure 7B:
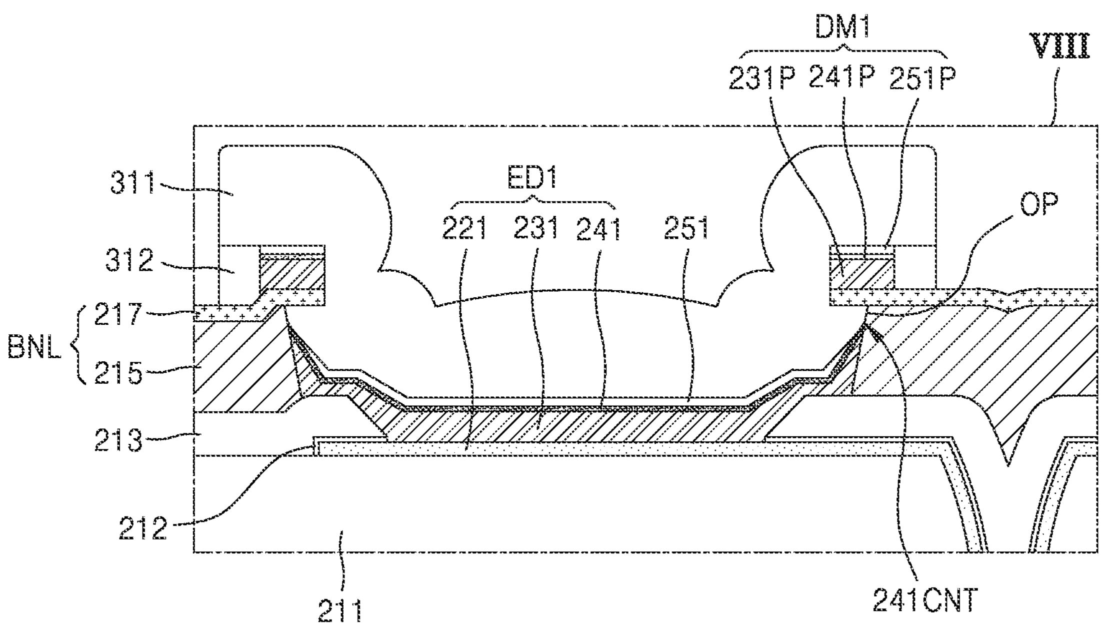

FIGS. 7A and 7B are schematic cross-sectional views of a portion of a display panel DP according to an embodiment. FIG. 7A shows a cross-section of the display panel DP of FIG. 3, taken along line IV-IV', and FIG. 7B shows portion VIII of the display panel DP shown in FIG. 7A.

Referring to FIGS. 7A and 7B, multiple pixels each including a light-emitting diode and a pixel circuit electrically connected to the light-emitting diode may be arranged in the display area DA of the substrate 100. For example, a first light-emitting diode ED1, a second light-emitting diode ED2, and a third light-emitting diode ED3 may be arranged in the display area DA of the substrate 100. The first light-emitting diode ED1, the second light-emitting diode ED2, and the third light-emitting diode ED3 may emit light of different wavelengths. For example, the first light-emitting diode ED1, the second light-emitting diode ED2, and the third light-emitting diode ED3 may each emit red, green, blue, or white light.

The substrate 100 may include a glass material or a polymer resin. For example, the polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, and/or the like. The substrate 100 including the polymer resin may be flexible, rollable, or bendable. The substrate 100 may have a multi-layered structure including a layer including the aforementioned polymer resin and an inorganic layer (not shown).

A buffer layer 201 may be located on the upper surface of the substrate 100. The buffer layer 201 may prevent impurities from penetrating into a semiconductor layer of a pixel circuit. The buffer layer 201 may include an inorganic insulating material, such as silicon nitride, silicon oxynitride, and silicon oxide, and may include a single layer or multiple layers including the aforementioned inorganic insulating material.

A first pixel circuit PC1, a second pixel circuit PC2, and a third pixel circuit PC3 may be disposed on the buffer layer 201. Because the first pixel circuit PC1, the second pixel circuit PC2, and the third pixel circuit PC3 have substantially the same or similar structures, hereinafter, just the first pixel circuit PC1 will be described.

The first pixel circuit PC1 may include multiple transistors and a storage capacitor Cst. Regarding this, FIG. 7A shows that the first pixel circuit PC1 includes a thin-film transistor TFT and the storage capacitor Cst.

The thin-film transistor TFT may include a semiconductor layer Act on the buffer layer 201, a gate electrode GE overlapping a channel region of the semiconductor layer Act, a source electrode SE, and a drain electrode DE. The semiconductor layer Act may include a silicon-based semiconductor material, for example, polysilicon. In another embodiment, the semiconductor layer Act may include an oxide-based semiconductor material, for example, a Zn oxide-based material. The semiconductor layer Act may include an In—Ga—Zn—O (IGZO), In—Sn—Zn—O (ITZO), and/or In—Ga—Sn—Zn—O (IGTZO) semiconductor in which metal, such as indium (In), gallium (Ga), and/or tin (Sn), may be contained in ZnO.

The semiconductor layer Act may include a channel region and impurity regions disposed on both sides of the channel region. One of the impurity regions disposed on both sides of the channel region may correspond to a source region and the other may correspond to a drain region.

A first gate insulating layer 203 may be disposed between the semiconductor layer Act and the gate electrode GE. The first gate insulating layer 203 may include an inorganic insulating material, such as silicon oxide, silicon nitride, and/or silicon oxynitride, and may have a single-layered or multi-layered structure including the aforementioned inorganic insulating material.

The gate electrode GE may include a conductive material including molybdenum, aluminum, copper, titanium, and/or the like, and may have a single-layered or multi-layered structure including the aforementioned conductive material.

The storage capacitor Cst may include a lower electrode CE1 and an upper electrode CE2 overlapping each other. In an embodiment, the lower electrode CE1 of the storage capacitor Cst may include the gate electrode GE of the thin-film transistor TFT. For example, the gate electrode GE of the thin-film transistor TFT may be formed integrally with the lower electrode CE1 of the storage capacitor Cst.

A first interlayer insulating layer 205 may be disposed between the lower electrode CE1 of the storage capacitor Cst and the upper electrode CE2 thereof, and a second interlayer insulating layer 207 may be disposed on the upper electrode CE2 of the storage capacitor Cst. Each of the first interlayer insulating layer 205 and the second interlayer insulating layer 207 may include an inorganic insulating material, such as silicon oxide, silicon nitride, and/or silicon oxynitride, and may have a single-layered or multi-layered structure including the aforementioned inorganic insulating material.

The source electrode SE and/or the drain electrode DE may be disposed on the second interlayer insulating layer 207. In some embodiments, one of the source electrode SE and the drain electrode DE may be omitted. The source electrode SE and/or the drain electrode DE may include a conductive material including molybdenum, aluminum, copper, titanium, and/or the like, and may have a single-layered or multi-layered structure including the aforementioned conductive material. For example, the source electrode SE and/or the drain electrode DE may have a multi-layered structure including titanium/aluminum/titanium (Ti/Al/Ti) layers.

A first planarization layer 209 may be disposed to cover the source electrode SE and/or the drain electrode DE. In an embodiment, the first planarization layer 209 may include an organic insulating material. The organic insulating material may include acrylic, benzocyclobutene (BCB), polyimide, hexamethyldisiloxane (HMDSO), and/or the like. In another embodiment, the first planarization layer 209 may include an inorganic insulating material. The inorganic insulating material may include silicon oxide, silicon nitride, and/or silicon oxynitride.

A connection electrode CM may be disposed on the first planarization layer 209. The connection electrode CM may be connected to the source electrode SE or the drain electrode DE of the thin-film transistor TFT through a contact hole passing through the first planarization layer 209. The connection electrode CM may include a conductive material including molybdenum, aluminum, copper, titanium, and/or the like, and may have a single-layered or multi-layered structure including the aforementioned conductive material. For example, the connection electrode CM may have a multi-layered structure including titanium/aluminum/titanium (Ti/Al/Ti) layers.

A second planarization layer 211 may be disposed to cover the connection electrode CM. The second planarization layer 211 may include an organic insulating material. The organic insulating material may include acrylic, BCB, polyimide, HMDSO, and/or the like.

A first light-emitting diode ED1, a second light-emitting diode ED2, and a third light-emitting diode ED3 may be disposed on the second planarization layer 211. The first light-emitting diode ED1 may be electrically connected to the first pixel circuit PC1, the second light-emitting diode ED2 may be electrically connected to the second pixel circuit PC2, and the third light-emitting diode ED3 may be electrically connected to the third pixel circuit PC3.

The first light-emitting diode ED1 may include a first pixel electrode 221, a first intermediate layer 231, and a first opposite electrode 241, the second light-emitting diode ED2 may include a second pixel electrode 223, a second intermediate layer 233, and a second opposite electrode 243, and the third light-emitting diode ED3 may include a third pixel electrode 225, a third intermediate layer 235, and a third opposite electrode 245. Because the first light-emitting diode ED1, the second light-emitting diode ED2, and the third light-emitting diode ED3 have substantially the same or similar structures, hereinafter, just the first light-emitting diode ED1 will be described.

The first pixel electrode 221 may be disposed on the second planarization layer 211 and may be electrically connected to the connection electrode CM through a contact hole passing through the second planarization layer 211. Although FIG. 7A shows that the first planarization layer 209 and the second planarization layer 211 are disposed between the drain electrode DE of the thin-film transistor TFT and the first pixel electrode 221, in another embodiment, one planarization layer may be disposed between the drain electrode DE of the thin-film transistor TFT and the first pixel electrode 221. The connection electrode CM may be omitted, and the first pixel electrode 221 may be directly connected to the drain electrode DE. In another embodiment, three or more planarization layers may be disposed between the drain electrode DE of the thin-film transistor TFT and the first pixel electrode 221. The first pixel electrode 221 may be electrically connected to the drain electrode DE through multiple connection electrodes.

The first pixel electrode 221 may be formed to be a (semi) transparent electrode or a reflective electrode. In case that the first pixel electrode 221 is formed as a (semi)transparent electrode, the first pixel electrode 221 may include, for example, indium tin oxide (ITO), indium zinc oxide (IZO), zinc oxide (ZnO), indium oxide ($In_2O_3$), indium gallium oxide (IGO), and/or aluminum zinc oxide (AZO). In case that the first pixel electrode 221 is formed as a reflective electrode, the reflective electrode may include a reflective layer including Ag, Mg, Al, Pt, Pd, Au, Ni, Nd, Ir, Cr, or a compound thereof, and a layer including ITO, IZO, ZnO, or $In_2O_3$ on the reflective layer. In an embodiment, the first pixel electrode 221 may have a structure in which an ITO layer, an Ag layer, and an ITO layer are sequentially stacked on each other.

An inorganic bank layer 213 may be disposed on the second planarization layer 211 to cover an edge of the first pixel electrode 221. The inorganic bank layer 213 may have openings respectively corresponding to the first pixel electrode 221, the second pixel electrode 223, and the third pixel electrode 225. The inorganic bank layer 213 may include an inorganic insulating material, such as silicon oxide, silicon nitride, and/or silicon oxynitride, and may have a single-layered or multi-layered structure including the aforementioned inorganic insulating material. The inorganic bank layer 213 may increase the distance between the edge of the first pixel electrode 221 and the first opposite electrode 241, thereby preventing an arc or the like from occurring between them.

A residual sacrificial layer 212 may be disposed between the first pixel electrode 221, the second pixel electrode 223, and the third pixel electrode 225 and the inorganic bank layer 213. The residual sacrificial layer 212 may be an element for preventing the first pixel electrode 221, the second pixel electrode 223, and the third pixel electrode 225 from being damaged by gas or liquid materials used in an etching process or an ashing process included in a process of manufacturing the display panel DP. For example, the residual sacrificial layer 212 may be a portion of an element for protecting the upper surfaces of the first pixel electrode 221, the second pixel electrode 223, and the third pixel electrode 225 in a dry etching process for forming pixel openings OP to be described below. The residual sacrificial layer 212 may have openings overlapping the pixel openings OP.

The residual sacrificial layer 212 may include a material that may be selectively etched without damaging the first pixel electrode 221. For example, the residual sacrificial layer 212 may include a conductive oxide, such as IZO and/or IGZO.

A metal bank layer BNL may be located on the inorganic bank layer 213 and may have pixel openings OP respectively overlapping the first pixel electrode 221, the second pixel electrode 223, and the third pixel electrode 225. The metal bank layer BNL may be entirely formed on the inorganic bank layer 213.

The metal bank layer BNL may include a first sub-metal layer 215 and a second sub-metal layer 217, which include different metals. The first sub-metal layer 215 and the second sub-metal layer 217 may include different metals having different etching selectivities. For example, the first sub-metal layer 215 may include aluminum (Al) or molybdenum (Mo), and the second sub-metal layer 217 may include titanium (Ti) or tantalum (Ta).

The second sub-metal layer 217 may have tips PT each extending from the upper surface of the first sub-metal layer 215 toward the center of each of the pixel openings OP. For example, a portion of the first sub-metal layer 215 positioned below the second sub-metal layer 217 may be removed in each pixel opening OP to form an undercut structure in which the second sub-metal layer 217 protrudes.

The first intermediate layer 231 may be located on the first pixel electrode 221 through the pixel opening OP of the metal bank layer BNL. The first intermediate layer 231 may include an emission layer. The emission layer may include a polymer or a low molecular weight organic material that emits light having a certain color (red, green, or blue). In another embodiment, the emission layer may include an inorganic material or quantum dots.

The first intermediate layer 231 may include a functional layer between the first pixel electrode 221 and the emission layer and/or between the emission layer and the first opposite electrode 241. The functional layer may include a hole transport layer (HTL), a hole injection layer (HIL), an electron transport layer (ETL), and/or an electron injection layer (EIL).

The first intermediate layer 231 may have a single stack structure including a single emission layer or a tandem structure that is a multi-stack structure including multiple emission layers. In case that the first intermediate layer 231 has a tandem structure, a charge generation layer (CGL) may be disposed between multiple stacks.

In an embodiment, the first intermediate layer 231 may be deposited on the entire surface of the display area DA, and a deposition material for forming the first intermediate layer 231 may form a first dummy intermediate layer 231P positioned on the second sub-metal layer 217. The first intermediate layer 231 and the first dummy intermediate layer 231P may include the same material. In the specification, "A and B include the same material" may indicate that A and B are formed at the same time and/or by the same process. A and B including the same material may have the same membrane quality. The first intermediate layer 231 and the first dummy intermediate layer 231P may be separated and apart from each other by the tip PT of the second sub-metal layer 217.

FIG. 7A shows that the first intermediate layer 231 is not formed in a region covered by the tip PT of the second sub-metal layer 217. In some embodiments, as shown in FIG. 7B, the first intermediate layer 231 may be also deposited on the region covered by the tip PT of the second sub-metal layer 217 and contact the sidewall of the first sub-metal layer 231 defining the pixel opening OP. The thickness of a portion contacting the sidewall of the first sub-metal layer 215 may be equal to or less than half of the thickness of a portion positioned on the upper surface of the first pixel electrode 221 and the upper surface of the second sub-metal layer 217.

Similarly, the second intermediate layer 233 may include the same material as a second dummy intermediate layer 233P, and the third intermediate layer 235 may include the same material as a third dummy intermediate layer 235P. The second intermediate layer 233 and the second dummy intermediate layer 233P may be separated and spaced apart from each other by the tip PT of the second sub-metal layer 217. The third intermediate layer 235 and the third dummy intermediate layer 235P may be separated and apart from each other by the tip PT of the second sub-metal layer 217.

The first opposite electrode 241 may be disposed on the first intermediate layer 231 through the pixel opening OP of the metal bank layer BNL. The first opposite electrode 241 may include a conductive material having a low work function. For example, the first opposite electrode 241 may include a (semi)transparent electrode including Ag, Mg, Al, Pt, Pd, Au, Ni, Nd, Ir, Cr, Li, Ca, or an alloy thereof. In another embodiment, the first opposite electrode 241 may further include a layer including ITO, IZO, ZnO, and/or $In_2O_3$ on the (semi)transparent layer including the material described above.

In an embodiment, the first opposite electrode 241 may be deposited on the entire surface of the display area DA, and a deposition material for forming the first opposite electrode 241 may form a first dummy opposite electrode 241P positioned on the first dummy intermediate layer 231P. The first opposite electrode 241 and the first dummy opposite electrode 241P may include the same material. The first opposite electrode 241 and the first dummy opposite electrode 241P may be separated and apart from each other by the tip PT of the second sub-metal layer 217.

Similarly, the second opposite electrode 243 and a second dummy opposite electrode 243P may include the same material, and the third opposite electrode 245 and a third dummy opposite electrode 245P may include the same material. The second opposite electrode 243 and the second dummy opposite electrode 243P may be separated and apart from each other by the tip PT of the second sub-metal layer 217. The third opposite electrode 245 and the third dummy opposite electrode 245P may be separated and apart from each other by the tip PT of the second sub-metal layer 217.

The first opposite electrode 241 may directly contact a side surface of the first sub-metal layer 215 defining the pixel opening OP of the metal bank layer BNL. For example, the first opposite electrode 241 may directly contact a sidewall of the first sub-metal layer 215 which is covered by the tip PT of the second sub-metal layer 217 and on which the first intermediate layer 231 is not formed. For example, as shown in FIG. 7B, the thickness of the first intermediate layer 231 may rapidly decrease in a region covered by the tip PT of the second sub-metal layer 217, and at least a portion of the sidewall of the first sub-metal layer 215 may be exposed. Because an incident angle of a deposition material forming the first opposite electrode 241 is greater than an incident angle of a deposition material forming the first intermediate layer 231, the first opposite electrode 241 may extend to the sidewall of the first sub-metal layer 215 on which the first intermediate layer 231 is not formed. Accordingly, the first opposite electrode 241 may form a contact portion 241CNT directly contacting the first sub-metal layer 215, and may receive the common voltage ELVSS through the metal bank layer BNL.

A first capping layer 251 may be disposed on the first opposite electrode 241. The first capping layer 251 may protect the first opposite electrode 241 and increase light extraction efficiency. The refractive index of the first capping layer 251 may be higher than that of the first opposite electrode 241. In another embodiment, the first capping layer 251 may be provided by stacking layers having different refractive indices. For example, the refractive index of the first capping layer 251 may be about 1.7 to about 1.9. The first capping layer 251 may include an organic material and may include an inorganic insulating material, such as LiF. As shown in FIG. 7B, the first capping layer 251 may be also deposited on the region covered by the tip PT of the second sub-metal layer 217, and the thickness of a portion adjacent to the sidewall of the first sub-metal layer 215 may be equal to or less than half of the thickness of a portion corresponding to the upper surface of the first pixel electrode 221 and the upper surface of the second sub-metal layer 217.

In an embodiment, the first capping layer 251 may be deposited on the entire surface of the display area DA, and a deposition material for forming the first capping layer 251 may form a first dummy capping layer 251P positioned on the first dummy opposite electrode 241P. The first capping layer 251 and the first dummy capping layer 251P may include the same material. The first capping layer 251 and the first dummy capping layer 251P may be separated and apart from each other by the tip PT of the second sub-metal layer 217.

Similarly, a second capping layer 253 and a second dummy capping layer 253P may include the same material, and a third capping layer 255 and a third dummy capping layer 255P may include the same material. The second capping layer 253 and the second dummy capping layer 253P may be separated and apart from each other by the tip PT of the second sub-metal layer 217. The third capping layer 255 and the third dummy capping layer 255P may be separated and apart from each other by the tip PT of the second sub-metal layer 217.

A first dummy layer DM1 may include a first dummy intermediate layer 231P, a first dummy opposite electrode 241P, and a first dummy capping layer 251P. The first dummy layer DM1 may be adjacent to a pixel opening OP of the metal bank layer BNL corresponding to the first light-emitting diode ED1 and be located on the second sub-metal layer 217. In other words, the first dummy layer DM1 may have a closed loop shape overlapping the tip PT of the second sub-metal layer 217.

A second dummy layer DM2 may include a second dummy intermediate layer 233P, a second dummy opposite electrode 243P, and a second dummy capping layer 253P. The second dummy layer DM2 may be adjacent to a pixel opening OP of the metal bank layer BNL corresponding to the second light-emitting diode ED2 and be located on the second sub-metal layer 217. A portion 312P of a first clad layer 312 may remain between the second dummy layer DM2 and the metal bank layer BNL. A third dummy layer DM3 may include a third dummy intermediate layer 235P, a third dummy opposite electrode 245P, and a third dummy capping layer 255P. The third dummy layer DM3 may be adjacent to a pixel opening OP of the metal bank layer BNL corresponding to the third light-emitting diode ED3 and be located on the second sub-metal layer 217. A portion of a second clad layer 314 may remain between the third dummy layer DM3 and the metal bank layer BNL.

A first inorganic encapsulation layer 311 may be formed on the first capping layer 251 to seal the first light-emitting diode ED1. The first inorganic encapsulation layer 311 may include silicon nitride or silicon oxynitride.

The first inorganic encapsulation layer 311 may have relatively excellent step coverage and thus may directly contact the lower surface of the tip PT of the second sub-metal layer 217 and the side surface of the first sub-metal layer 215 and form an inorganic contact area completely surrounding the first light-emitting diode ED1. Accordingly, the first inorganic encapsulation layer 311 may reduce or block a path through which impurities penetrate into the first light-emitting diode ED1.

Similarly, a second inorganic encapsulation layer 313 for sealing the second light-emitting diode ED2 may be disposed on the second capping layer 253, and a third inorganic encapsulation layer 315 for sealing the third light-emitting diode ED3 may be disposed on the third capping layer 255.

The first inorganic encapsulation layer 311, the second inorganic encapsulation layer 313, and the third inorganic encapsulation layer 315 may be apart from each other. For example, the first inorganic encapsulation layer 311 may be patterned in an island shape to cover the first light-emitting diode ED1, the second inorganic encapsulation layer 313 may be patterned in an island shape to cover the second light-emitting diode ED2, and the third inorganic encapsulation layer 315 may be patterned in an island shape to cover the third light-emitting diode ED3.

The first clad layer 312 may be disposed to cover an end of the first dummy layer DM1 positioned between the first inorganic encapsulation layer 311 and the metal bank layer BNL. The first clad layer 312 may prevent impurities from penetrating into the first light-emitting diode ED1 through the first dummy layer DM1. The first clad layer 312 may include silicon nitride or silicon oxynitride.

Similarly, the second clad layer 314 may be disposed to cover an end of the second dummy layer DM2, and a third clad layer 316 may be disposed to cover an end of the third dummy layer DM3.

An organic encapsulation layer 320 may be located on the first inorganic encapsulation layer 311, the second inorganic encapsulation layer 313, and the third inorganic encapsulation layer 315. The organic encapsulation layer 320 may provide a flat base surface to components disposed thereon. The organic encapsulation layer 320 may include a polymer-based material. Examples of the polymer-based material may include acrylic resin, epoxy resin, polyimide, and polyethylene.

A fourth inorganic encapsulation layer 330 may be disposed on the organic encapsulation layer 320. The fourth inorganic encapsulation layer 330 may include one or more inorganic materials selected from among aluminum oxide, titanium oxide, tantalum oxide, hafnium oxide, zinc oxide, silicon oxide, silicon nitride, and silicon oxynitride.

Figure 8:
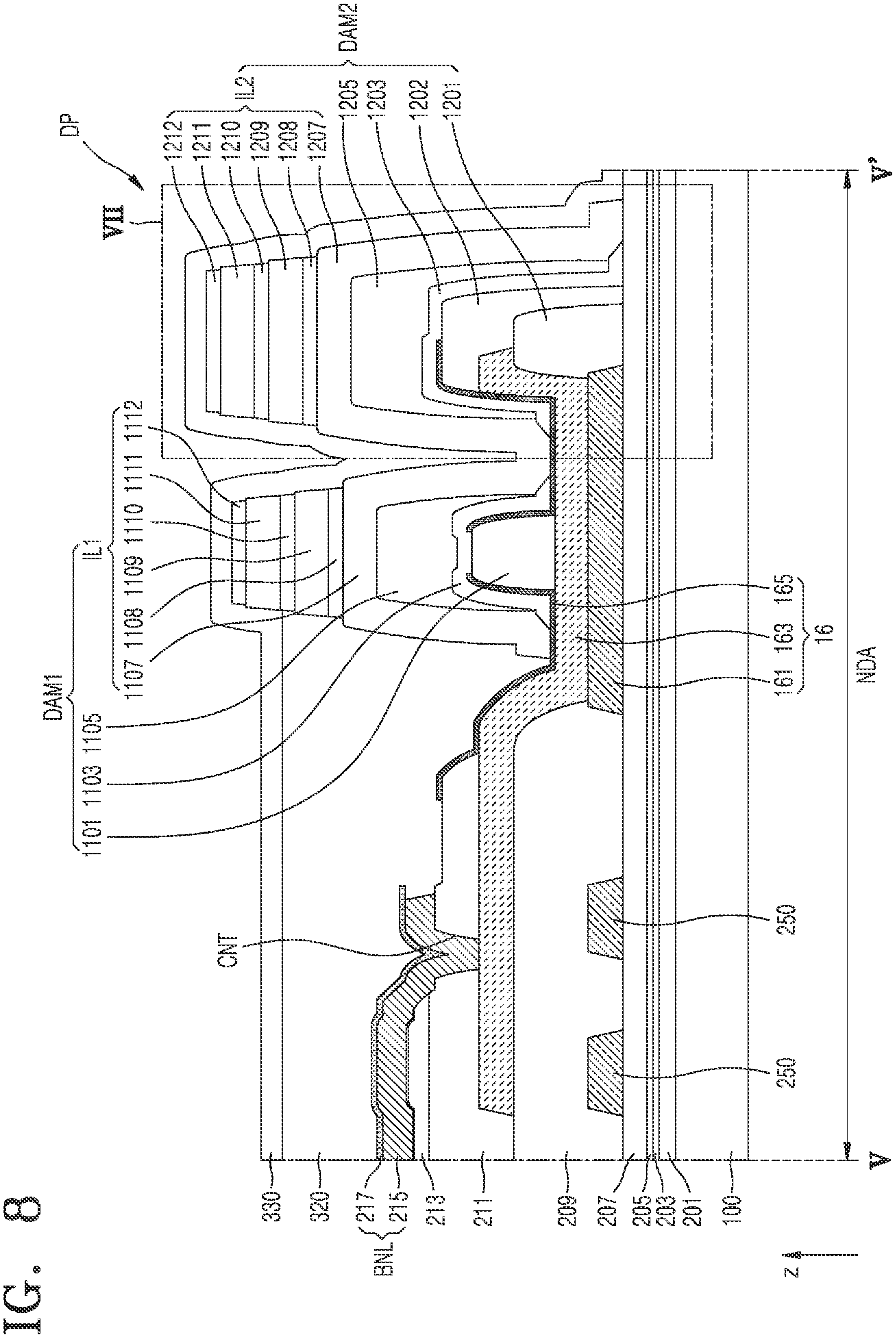
FIG. 8 is a schematic cross-sectional view of a portion of a display panel according to an embodiment.

FIG. 8 is a schematic cross-sectional view of a portion of a display panel DP according to an embodiment, and FIGS. 9A to 9E are schematic cross-sectional views of a portion of a display panel according to embodiments. FIG. 8 shows a cross-section of the display panel DP of FIG. 6, taken along line V-V' in FIG. 6. FIGS. 9A to 9E show various embodiments of area VII of the display panel DP shown in FIG. 8.

From the display area DA (see FIG. 6) to the non-display area NDA, a buffer layer 201, a first gate insulating layer 203, a first interlayer insulating layer 205, a second interlayer insulating layer 207, a first planarization layer 209, and a second planarization layer 211 may extend and be disposed.

Multiple signal lines 250 may be arranged between the second interlayer insulating layer 207 and the first planarization layer 209. Each of the signal lines 250 may include a conductive material including molybdenum, aluminum, copper, titanium, and/or the like, and may have a single-layered or multi-layered structure including the aforementioned conductive material.

A common power supply line 16 may be located in the non-display area NDA. The common power supply line 16 may be arranged parallel to the edge 100E (see FIG. 6) of the substrate 100 to surround at least a portion of the display area DA (see FIG. 6). The common power supply line 16 may include a first line 161, a second line 163 positioned on the first line 161, and a third line 165 positioned on the second line 163.

The first line 161 may be disposed on the second interlayer insulating layer 207 and may have an inner edge covered by the first planarization layer 209. The second line 163 may be disposed between the first planarization layer 209 and the second planarization layer 211 and may be connected to the first line 161 outside the first planarization layer 209. Each of the first line 161 and the second line 163 may include a conductive material including molybdenum, aluminum, copper, titanium, and/or the like, and may have a single-layered or multi-layered structure including the aforementioned conductive material. In an embodiment, the first line 161 may include the same material as the source electrode SE and/or the drain electrode DE, and the second line 163 may include the same material as the connection electrode CM.

The third line 165 may be disposed on the second planarization layer 211 and may be connected to the second line 163 outside the second planarization layer 211. The third line 165 may include the same material as the first pixel electrode 221. In an embodiment, the third line 165 may have a structure in which an ITO layer, an Ag layer, and an ITO layer are sequentially stacked on each other.

The first sub-metal layer 215 of the metal bank layer BNL may be connected to the second line 163 of the common power supply line 16 through a contact hole CNT passing through the second planarization layer 211. Accordingly, the metal bank layer BNL may receive the common voltage ELVSS from the common power supply line 16.

A first dam DAM1 and a second dam DAM2 may be arranged apart from each other on the non-display area NDA. FIG. 8 shows that the first dam DAM1 includes a first-first organic layer 1101, a first lower inorganic layer 1103, a first-second organic layer 1105, and a first inorganic stack IL1 and a second dam DAM2 includes a second-first organic layer 1201, a second-second organic layer 1202, a second lower inorganic layer 1203, a second-third organic layer 1205, and a second inorganic stack IL2. However, the disclosure is not limited thereto. For example, the first dam DAM1 and/or the second dam DAM2 may further include one or more organic layers, one or more inorganic layers, and/or one or more metal layers. In another embodiment, some of the layers constituting the first dam DAM1 and/or the second dam DAM2 may be omitted.

The first and second inorganic stacks IL1 and IL2 may have substantially the same or similar structures. For example, the first inorganic stack IL1 may include a first inorganic layer 1107 to a sixth inorganic layer 1112 which are sequentially stacked on each other, and the second inorganic stack IL2 may include a first inorganic layer 1207 to a sixth inorganic layer 1212 which are sequentially stacked on each other.

The first dam DAM1 may be disposed to overlap the common power supply line 16. For example, the first-first organic layer 1101 of the first dam DAM1 may be located on the second line 163 of the common power supply line 16. The third line 165 of the common power supply line 16 may be disposed to cover at least a portion of the first-first organic layer 1101.

The first-first organic layer 1101 may include an organic insulating material. The organic insulating material may include acrylic, BCB, polyimide, HMDSO, and/or the like. In an embodiment, the first-first organic layer 1101 may include the same material as the second planarization layer 211.

The first lower inorganic layer 1103 may be arranged to overlap the first-first organic layer 1101 in a plan view. In other words, the first lower inorganic layer 1103 may be disposed on the third line 165. The first lower inorganic layer 1103 may include an inorganic insulating material, such as silicon oxide, silicon nitride, and/or silicon oxynitride, and may have a single-layered or multi-layered structure including the aforementioned inorganic insulating material. In an embodiment, the first lower inorganic layer 1103 may include the same material as the inorganic bank layer 213.

The first-second organic layer 1105 may be disposed on the first lower inorganic layer 1103. The first-second organic layer 1105 may include an organic insulating material. The organic insulating material may include acrylic, BCB, polyimide, HMDSO, and/or the like. As shown in FIG. 9C, in some embodiments, the first-second organic layers 1105 may be omitted.

The first inorganic stack IL1 may include a first-first inorganic layer 1107, a first-second inorganic layer 1108, a first-third inorganic layer 1109, a first-fourth inorganic layer 1110, a first-fifth inorganic layer 1111, and a first-sixth inorganic layer 1112.

The first-first inorganic layer 1107, the first-third inorganic layer 1109, and the first-fifth inorganic layer 1111 may include silicon nitride or silicon oxynitride. The first-first inorganic layer 1107 may include the same material as the first inorganic encapsulation layer 311. The first-third inorganic layer 1109 may include the same material as the second inorganic encapsulation layer 313. The first-fifth inorganic layer 1111 may include the same material as the third inorganic encapsulation layer 315. For example, the first-first inorganic layer 1107 may be formed simultaneously with the first inorganic encapsulation layer 311 in the process of forming the first inorganic encapsulation layer 311, and the first-third inorganic layer 1109 may be formed simultaneously with the second inorganic encapsulation layer 313 in the process of forming the second inorganic encapsulation layer 313. The first-fifth inorganic layer 1111 may be formed simultaneously with the third inorganic encapsulation layer 315 in the process of forming the third inorganic encapsulation layer 315.

The first-second inorganic layer 1108, the first-fourth inorganic layer 1110, and the first-sixth inorganic layer 1112 may include silicon nitride. The first-second inorganic layer 1108 may include the same material as the first clad layer 312. The first-fourth inorganic layer 1110 may include the same material as the second clad layer 314. The first-sixth inorganic layer 1112 may include the same material as the third clad layer 316. For example, the first-second inorganic layer 1108 may be formed simultaneously with the first clad layer 312 in the process of forming the first clad layer 312, and the first-fourth inorganic layer 1110 may be formed simultaneously with the second clad layer 314 in the process of forming the second clad layer 314. The first-sixth inorganic layer 1112 may be formed simultaneously with the third clad layer 316 in the process of forming the third clad layer 316.

The second dam DAM2 may be disposed to cover an outer edge of the common power supply line 16. For example, the second-first organic layer 1201 of the second dam DAM2 may cover an outer edge of the first line 161 of the common power supply line 16, and the second-second organic layer 1202 may cover an outer edge of the second line 163 of the common power supply line 16. An outer edge of the third line 165 of the common power supply line 16 may be located between the second-second organic layer 1202 and the second lower inorganic layer 1203.

The second-first organic layer 1201 may include an organic insulating material. The organic insulating material may include acrylic, BCB, polyimide, HMDSO, and/or the like. In an embodiment, the second-first organic layer 1201 may include the same material as the first planarization layer 209.

The second-second organic layer 1202 may be disposed on the second-first organic layer 1201 to cover the second-first organic layer 1201. The outer edge of the second line 163 of the common power supply line 16 may be disposed on the second-first organic layer 1201, and the second-second organic layer 1202 may cover the outer edge of the second line 163. The second-second organic layer 1202 may include an organic insulating material. The organic insulating material may include acrylic, BCB, polyimide, HMDSO, and/or the like. In an embodiment, the second-second organic layer 1202 may include the same material as the second planarization layer 211. The first-first organic layer 1101 and the second-second organic layer 1202 may be formed simultaneously with the second planarization layer 211 in the process of forming the second planarization layer 211.

The second lower inorganic layer 1203 may be disposed on the second-second organic layer 1202 to cover the second-second organic layer 1202. In other words, the second lower inorganic layer 1203 may be disposed to cover the outer edge of the third line 165 of the common power supply line 16 positioned on the second-second organic layer 1202. The second lower inorganic layer 1203 may include an inorganic insulating material, such as silicon oxide, silicon nitride, and/or silicon oxynitride, and may have a single-layered or multi-layered structure including the aforementioned inorganic insulating material. In an embodiment, the second lower inorganic layer 1203 may include the same material as the inorganic bank layer 213. The first lower inorganic layer 1103 and the second lower inorganic layer 1203 may be formed simultaneously with the inorganic bank layer 213 in the process of forming the inorganic bank layer 213.

The second-third organic layer 1205 may be disposed on the second lower inorganic layer 1203. The second-third organic layer 1205 may include an organic insulating material. The organic insulating material may include acrylic, BCB, polyimide, HMDSO, and/or the like. As shown in FIG. 9C, in some embodiments, the second-third organic layer 1205 may be omitted.

The second inorganic stack IL2 may be disposed on the second lower inorganic layer 1203 or the second-third organic layer 1205, and may include a second-first inorganic layer 1207, a second-second inorganic layer 1208, a second-third inorganic layer 1209, a second-fourth inorganic layer 1210, a second-fifth inorganic layer 1211, and a second-sixth inorganic layer 1212.

The second-first inorganic layer 1207, the second-third inorganic layer 1209, and the second-fifth inorganic layer 1211 may include silicon nitride or silicon oxynitride. The second-first inorganic layer 1207 may include the same material as the first inorganic encapsulation layer 311. The second-third inorganic layer 1209 may include the same material as the second inorganic encapsulation layer 313. The second-fifth inorganic layer 1211 may include the same material as the third inorganic encapsulation layer 315. For example, the second-first inorganic layer 1207 may be formed simultaneously with the first inorganic encapsulation layer 311 in the process of forming the first inorganic encapsulation layer 311, and the second-third inorganic layer 1209 may be formed simultaneously with the second inorganic encapsulation layer 313 in the process of forming the second inorganic encapsulation layer 313. The second-fifth inorganic layer 1211 may be formed simultaneously with the third inorganic encapsulation layer 315 in the process of forming the third inorganic encapsulation layer 315.

The second-second inorganic layer 1208, the second-fourth inorganic layer 1210, and the second-sixth inorganic layer 1212 may include silicon nitride. The second-second inorganic layer 1208 may include the same material as the first clad layer 312. The second-fourth inorganic layer 1210 may include the same material as the second clad layer 314. The second-sixth inorganic layer 1212 may include the same material as the third clad layer 316. For example, the second-second inorganic layer 1208 may be formed simultaneously with the first clad layer 312 in the process of forming the first clad layer 312, and the second-fourth inorganic layer 1210 may be formed simultaneously with the second clad layer 314 in the process of forming the second clad layer 314. The second-sixth inorganic layers 1212 may be formed simultaneously with the third clad layer 316 in the process of forming the third clad layer 316.

In an embodiment, the first-second inorganic layer 1108, the first-third inorganic layer 1109, the second-second inorganic layer 1208, and the second-third inorganic layer 1209 may be formed by being etched at the same time. Therefore, the boundary of the first-second inorganic layer 1108 may coincide with the boundary of the first-third inorganic layer 1109, and the boundary of the second-second inorganic layer 1208 may coincide with the boundary of the second-third inorganic layer 1209. Similarly, the first-fourth inorganic layer 1110, the first-fifth inorganic layer 1111, the second-fourth inorganic layer 1210, and the second-fifth inorganic layer 1211 may be formed by being etched at the same time. Therefore, the boundary of the first-fourth inorganic layer 1110 may coincide with the boundary of the first-fifth inorganic layer 1111, and the boundary of the second-fourth inorganic layer 1210 may coincide with the boundary of the second-fifth inorganic layer 1211.

An end of the organic encapsulation layer 320 may be located on the side or upper surface of the first dam DAM1. A fourth inorganic encapsulation layer 330 may be disposed to cover the first dam DAM1 and the second dam DAM2. The fourth inorganic encapsulation layer 330 may pass by an end of the organic encapsulation layer 320 and directly contact a portion of the first inorganic stack IL1 and a portion of the second inorganic stack IL2 to form an inorganic contact region.

A stacked structure above the first lower inorganic layer 1103 of the first dam DAM1 may be substantially the same as or similar to a stacked structure above the second lower inorganic layer 1203 of the second dam DAM2. In the specification, various embodiments of the disclosure will be described below, focusing on the second dam DAM2.

Figure 9A:
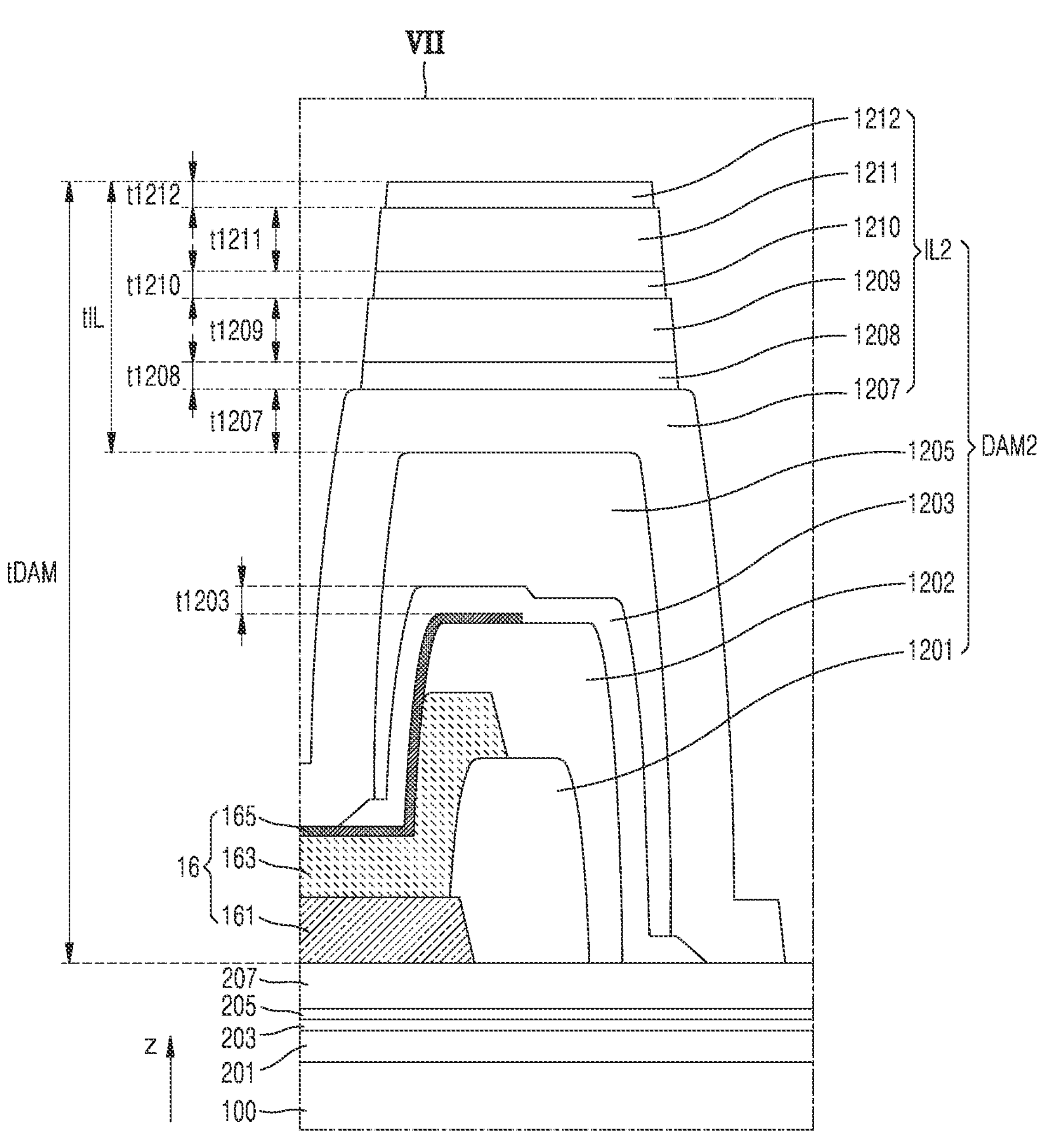
FIGS. 9A to 9E are schematic cross-sectional views of a portion of a display panel according to embodiments.

Referring to FIG. 9A, the second dam DAM2 may include a second-first organic layer 1201, a second-second organic layer 1202, a second lower inorganic layer 1203, a second-third organic layer 1205, and a second inorganic stack IL2. The second inorganic stack IL2 may include a second-first inorganic layer 1207 to a second-sixth inorganic layer 1212.

In order to control the flow of a monomer constituting the organic encapsulation layer 320, a height tDAM of the second dam DAM2 may be about 58,000 Å or more.

In an embodiment, a thickness t1203 of the second lower inorganic layer 1203 may be about 3,000 Å.

In an embodiment, a thickness t1207 of the second-first inorganic layer 1207, a thickness t1209 of the second-third inorganic layer 1209, and a thickness t1211 of the second-fifth inorganic layer 1211 may be substantially the same. In case that the second-first inorganic layer 1207, the second-third inorganic layer 1209, and the second-fifth inorganic layer 1211 include silicon nitride, the thickness t1207 of the second-first inorganic layer 1207, the thickness t1209 of the second-third inorganic layer 1209, and the thickness t1211 of the second-fifth inorganic layer 1211 may be about 7,000 Å or more. In case that the second-first inorganic layer 1207, the second-third inorganic layer 1209, and the second-fifth inorganic layer 1211 include silicon oxynitride, the thickness t1207 of the second-first inorganic layer 1207, the thickness t1209 of the second-third inorganic layer 1209, and the thickness t1211 of the second-fifth inorganic layer 1211 may be about 10,000 Å or more.

In an embodiment, a thickness t1208 of the second-second inorganic layer 1208, a thickness t1210 of the second-fourth inorganic layer 1210, and a thickness t1212 of the second-sixth inorganic layer 1212 may be substantially the same. For example, the thickness t1208 of the second-second inorganic layer 1208, the thickness t1210 of the second-fourth inorganic layer 1210, and the thickness t1212 of the second-sixth inorganic layer 1212 may be about 3,000 Å or more.

The height tDAM of the second dam DAM2 may need to be about 60,000 Å or more to effectively control the flow of the monomer. The thickness of the second-first organic layer 1201, the thickness of the second-second organic layer 1202, and the thickness of the second-third organic layer 1205 may each be about 15,000 Å. Because the thickness t1203 of the second lower inorganic layer 1203 is only about 3,000 Å, it may be necessary to compensate the height of the second dam DAM2 by stacking multiple inorganic layers on the second lower inorganic layer 1203. For example, a thickness tIL of the second inorganic stack IL2 shown in FIG. 9A may be about 30,000 Å or more, and the height tDAM of the second dam DAM2 may be about 78,000 Å or more.

Figure 9B:
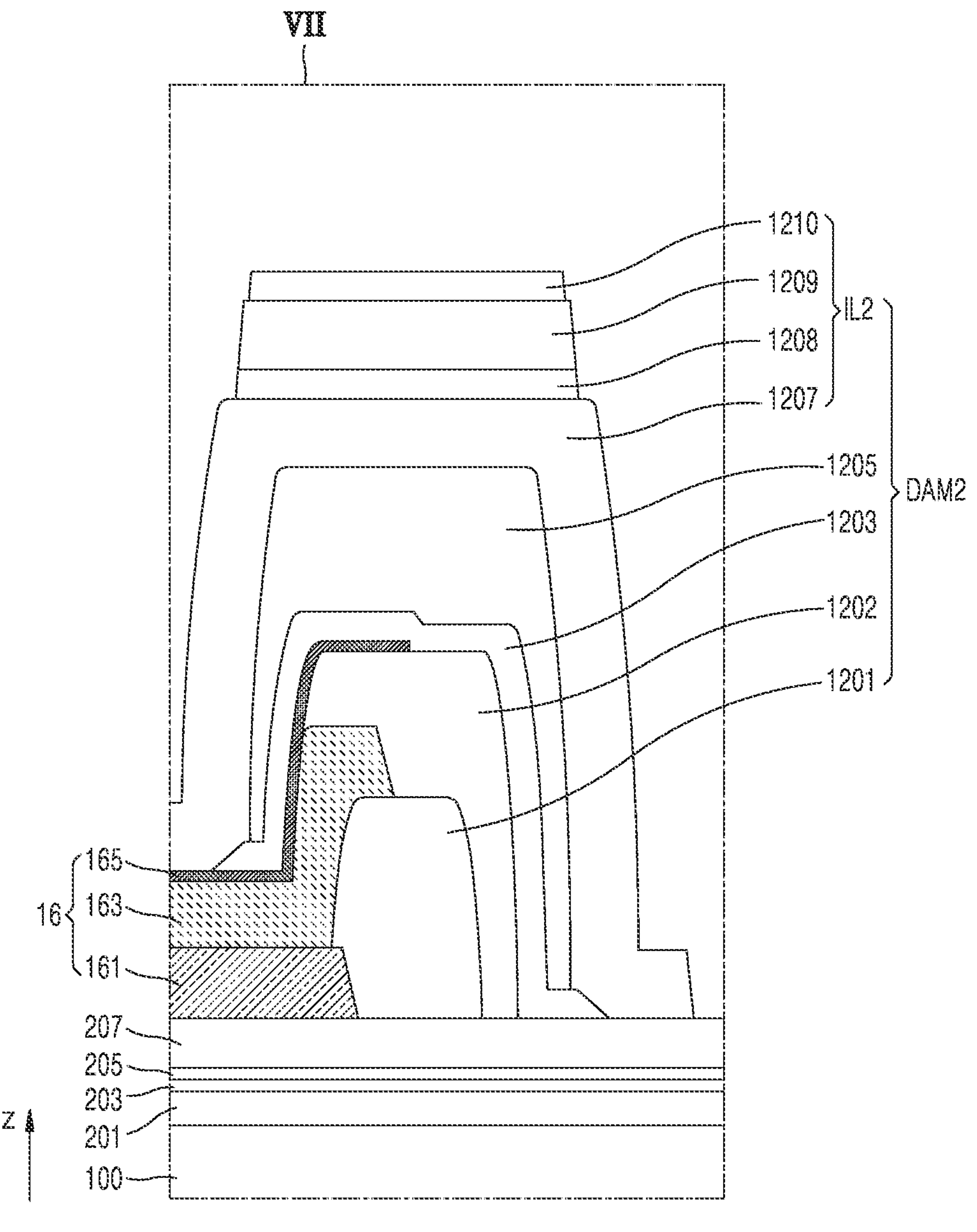
Figure 9C:
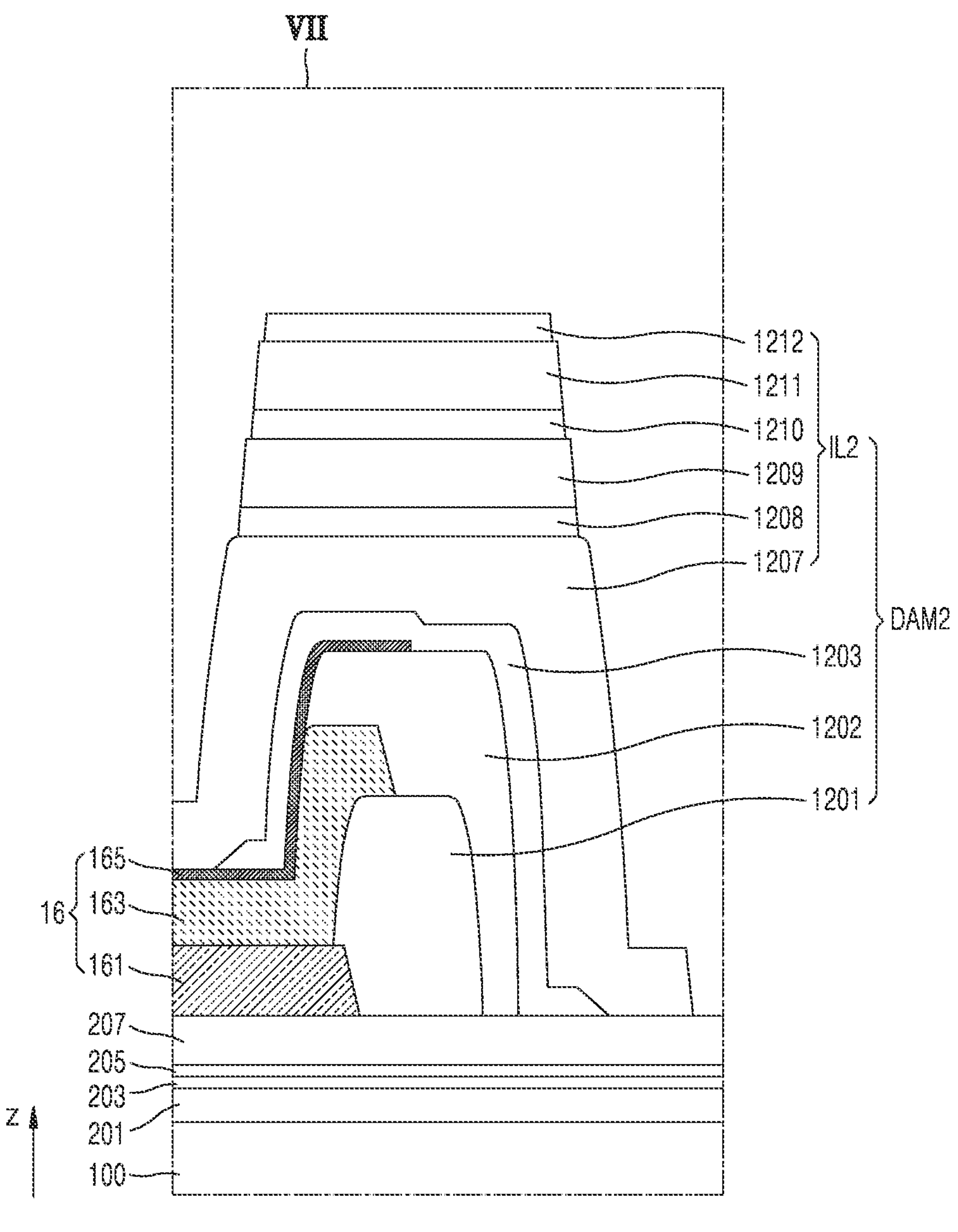

Referring to FIG. 9B, the second dam DAM2 may include a second-first organic layer 1201, a second-second organic layer 1202, a second lower inorganic layer 1203, a second-third organic layer 1205, and a second inorganic stack IL2, and the second inorganic stack IL2 may include a second-first inorganic layer 1207, a second-second inorganic layer 1208, a second-third inorganic layer 1209, and a second-fourth inorganic layer 1210. Although FIG. 9B illustrates that the second-fifth inorganic layer 1211 and the second-sixth inorganic layer 1212 are omitted, in another embodiment, the second inorganic stack IL2 may include the second-first inorganic layer 1207, the second-second inorganic layer 1208, the second-fifth inorganic layer 1211, and the second-sixth inorganic layer 1212. In another embodiment, the second inorganic stack IL2 may include only the second-first inorganic layer 1207 and the second-second inorganic layer 1208.

Referring to FIG. 9C, the second dam DAM2 may include a second-first organic layer 1201, a second-second organic layer 1202, a second lower inorganic layer 1203, and a second inorganic stack IL2. In other words, in some embodiments, the second-third organic layer 1205 may be omitted, and the second-first inorganic layer 1207 of the second inorganic stack IL2 may directly contact the second lower inorganic layer 1203. Accordingly, the process of manufacturing the display panel DP may be further simplified by omitting a mask process for forming the second-third organic layer 1205.

Figure 9D:
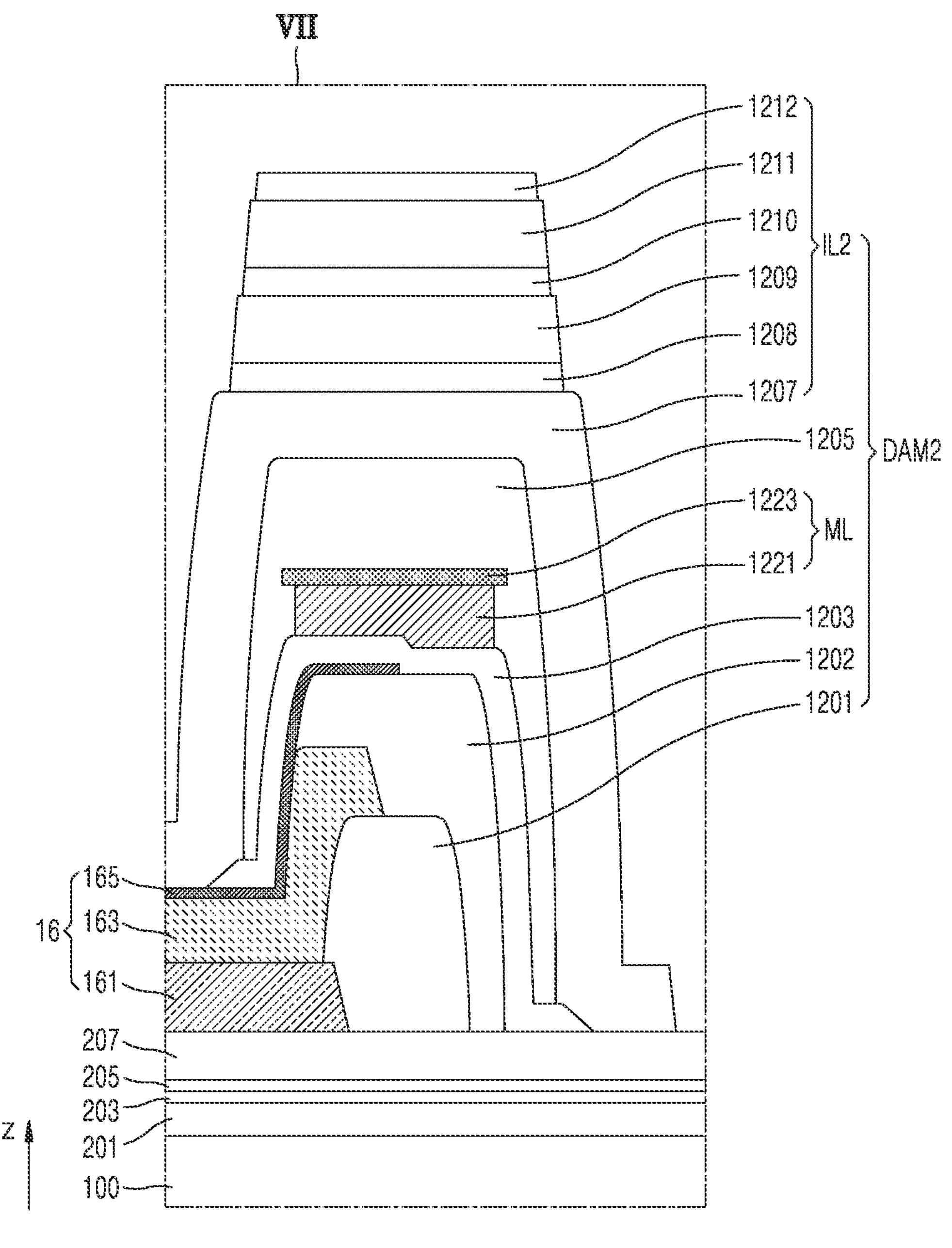

Referring to FIG. 9D, the second dam DAM2 may include a second-first organic layer 1201, a second-second organic layer 1202, a second lower inorganic layer 1203, a second-third organic layer 1205, and a second inorganic stack IL2, and may further include a metal layer ML between the second lower inorganic layer 1203 and the second-third organic layer 1205. The metal layer ML may be disposed to correspond to the upper surface of the second lower inorganic layer 1203.

The metal layer ML may include a first metal layer 1221 and a second metal layer 1223 on the first metal layer 1221. The first metal layer 1221 may include the same material as the first sub-metal layer 215 of the metal bank layer BNL, and the second metal layer 1223 may include the same material as the second sub-metal layer 217 of the metal bank layer BNL.

In an embodiment, the thickness of the metal layer ML may be about 7,000 Å or more. Accordingly, the height of the second dam DAM2 shown in FIG. 9D may be about 85,000 Å.

Figure 9E:
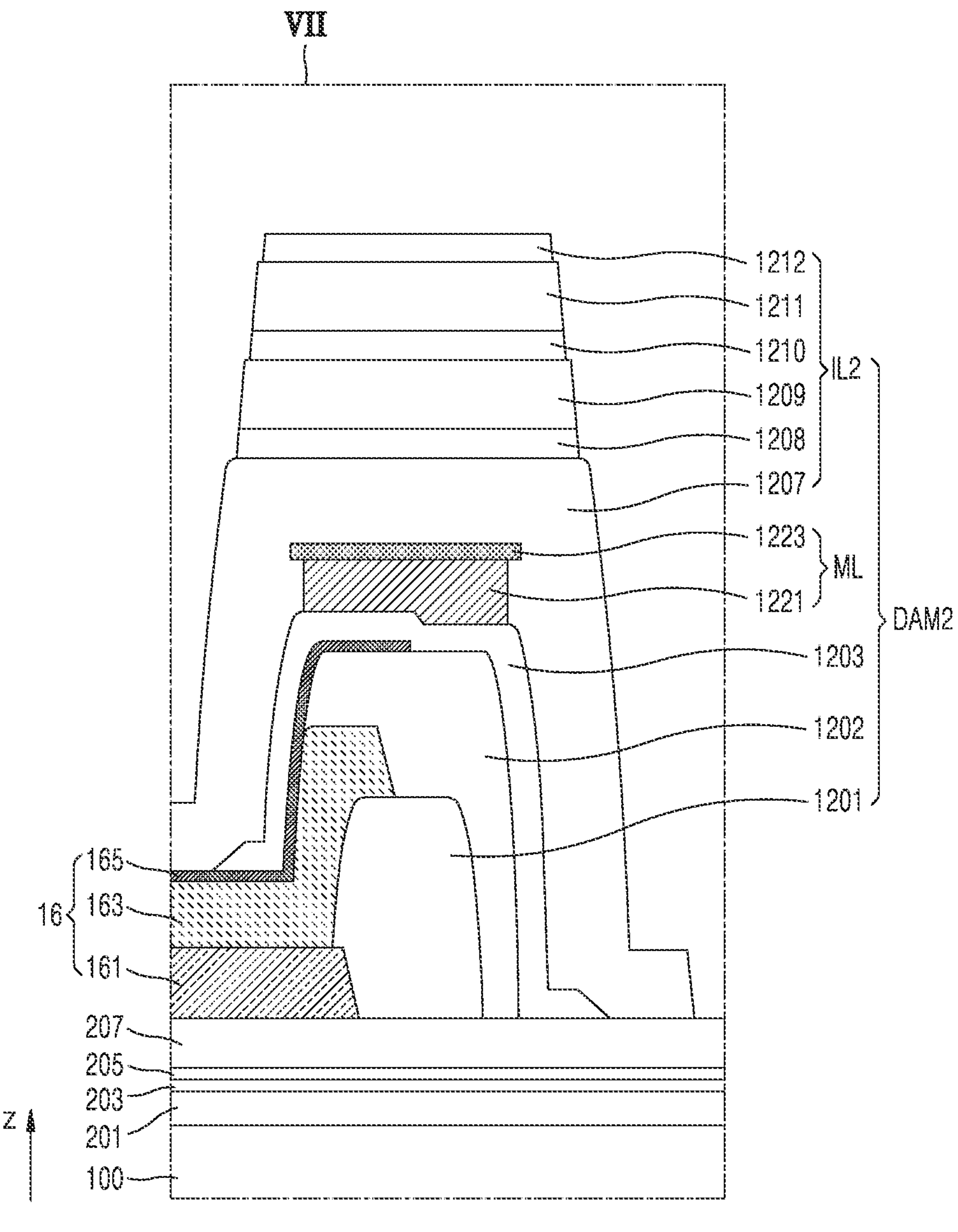

Referring to FIG. 9E, the second dam DAM2 may include a second-first organic layer 1201, a second-second organic layer 1202, a second lower inorganic layer 1203, and a second inorganic stack IL2, and may further include a metal layer ML between the second lower inorganic layer 1203 and the second-first inorganic layer 1207. In other words, in some embodiments, the second-third organic layer 1205 may be omitted, and the second-first inorganic layer 1207 of the second inorganic stack IL2 may directly contact the metal layer ML. Accordingly, the process of manufacturing the display panel DP may be further simplified by omitting a mask process for forming the second-third organic layer 1205.

FIGS. 10A to 14B are schematic cross-sectional views illustrating some steps in a process of manufacturing a display panel according to an embodiment.

Figure 10A:
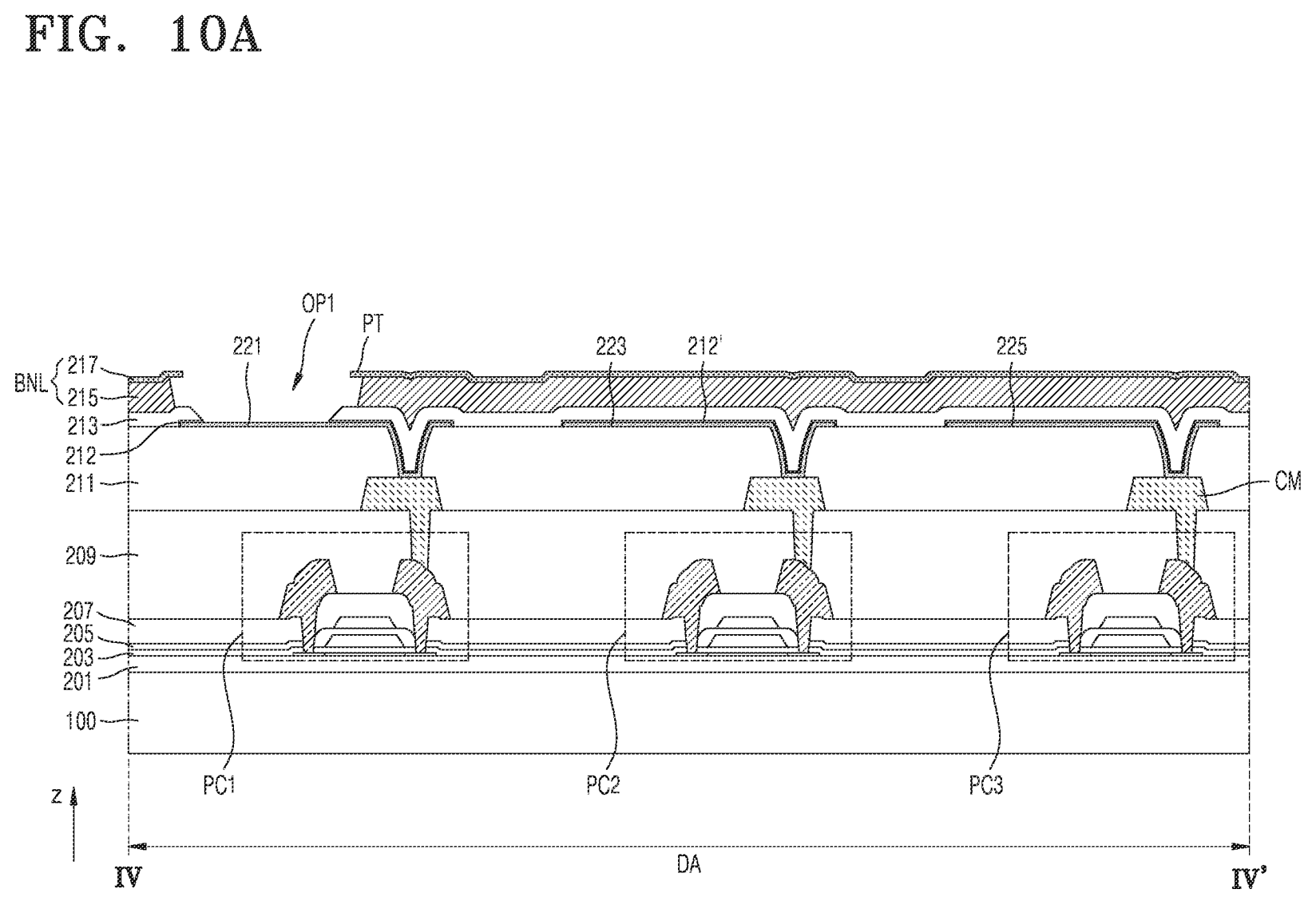
Figure 10B:
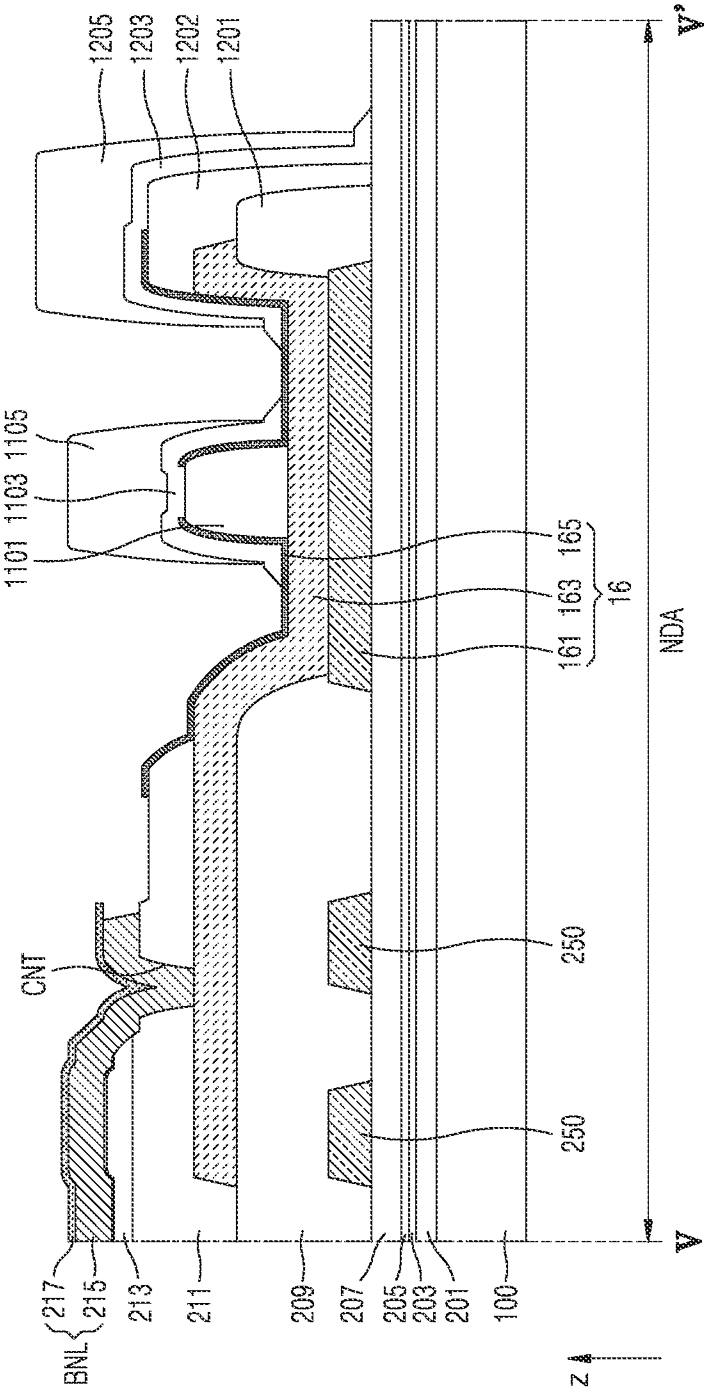

Referring to FIGS. 10A and 10B, a first pixel circuit PC1, a second pixel circuit PC2, and a third pixel circuit PC3 may be formed on a buffer layer 201 of a display area DA. A first gate insulating layer 203, a first interlayer insulating layer 205, and a second interlayer insulating layer 207 may be formed above, below, and/or between components constituting the first pixel circuit PC1, the second pixel circuit PC2, and the third pixel circuit PC3.

A first planarization layer 209 may be formed to cover the first pixel circuit PC1, the second pixel circuit PC2, and the third pixel circuit PC3, and a connection electrode CM may be formed on the first planarization layer 209. A second planarization layer 211 may be formed to cover the connection electrode CM, and a first pixel electrode 221, a second pixel electrode 223, and a third pixel electrode 225 may be formed on the second planarization layer 211.

The first pixel electrode 221 may be electrically connected to the first pixel circuit PC1 through the connection electrode CM. Similarly, the second pixel electrode 223 may be electrically connected to the second pixel circuit PC2, and the third pixel electrode 225 may be electrically connected to the third pixel circuit PC3.

A sacrificial layer 212' may be formed on the first pixel electrode 221, the second pixel electrode 223, and the third pixel electrode 225 to protect the first pixel electrode 221, the second pixel electrode 223, and the third pixel electrode 225. An inorganic bank layer 213 may be formed on the sacrificial layer 212', and a metal bank layer BNL may be formed on the inorganic bank layer 213. The metal bank layer BNL may include a first sub-metal layer 215 and a second sub-metal layer 217 including a metal that is different from that of the first sub-metal layer 215.

A first pixel opening OP1 may be formed to expose a central portion of the first pixel electrode 221. The first pixel opening OP1 may be formed by etching a portion of the metal bank layer BNL and a portion of the inorganic bank layer 213. Because the first sub-metal layer 215 and the second sub-metal layer 217 include different metals having different etching selectivities, the second sub-metal layer 217 may have a tip PT formed to extend toward the center of the first pixel opening OP1.

In the process of etching the first sub-metal layer 215, a portion of the sacrificial layer 212' covering the first pixel electrode 221 may be removed, and thus, a residual sacrificial layer 212 covering an edge of the first pixel electrode 221 may be formed.

Signal lines 250 and a common power supply line 16 may be formed in a non-display area NDA. The common power supply line 16 may include a first line 161, a second line 163, and a third line 165. The metal bank layer BNL may be connected to the second line 163 of the common power supply line 16 through a contact hole CNT passing through the second planarization layer 211 in the non-display area NDA.

A second-first organic layer 1201 may be formed to cover an outer edge of the first line 161 of the common power supply line 16, and a second-second organic layer 1202 may be formed to cover the second-first organic layer 1201. A first-first organic layer 1101 may be formed on the third line 165 of the common power supply line 16. The second-first organic layer 1201 may be formed simultaneously with the first planarization layer 209 through the same process, and the second-second organic layer 1202 may be formed simultaneously with the first-first organic layer 1101 and the second planarization layer 211 through the same process.

A first lower inorganic layer 1103 may be formed overlapping the first-first organic layer 1101 to cover the third line 165 of the common power supply line 16. A second lower inorganic layer 1203 may be formed overlapping the second-second organic layer 1202 to cover an outer edge of the third line 165 of the common power supply line 16. The first lower inorganic layer 1103 and the second lower inorganic layer 1203 may be formed simultaneously with the inorganic bank layer 213 through the same process.

A first-second organic layer 1105 may be formed on the first lower inorganic layer 1103, and a second-third organic layer 1205 may be formed on the second lower inorganic layer 1203. The first-second organic layer 1105 and the second-third organic layer 1205 may be formed simultaneously with each other through the same process. In some embodiments, a process of forming the first-second organic layer 1105 and the second-third organic layer 1205 may be omitted.

Figure 11A:
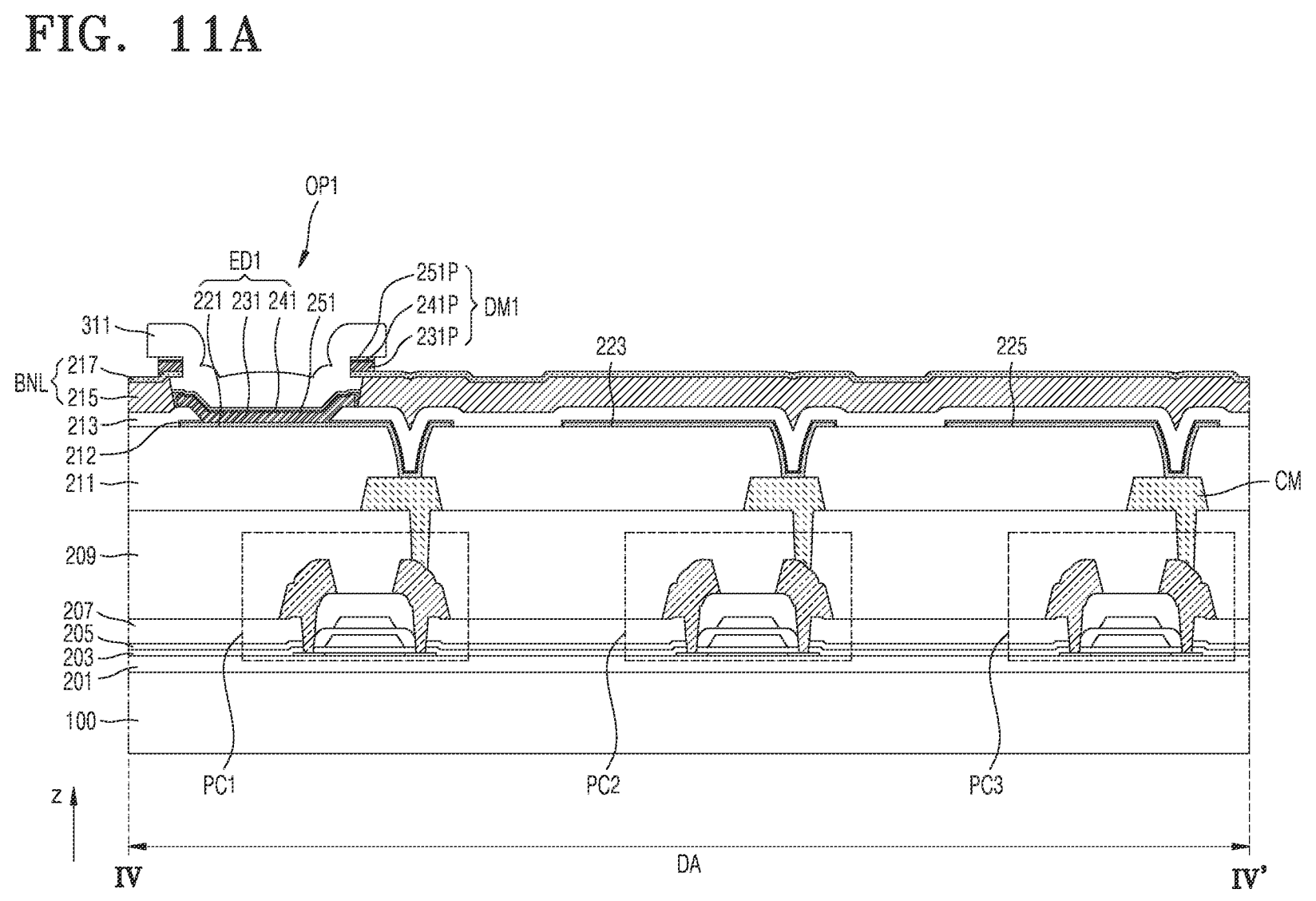
Figure 11B:
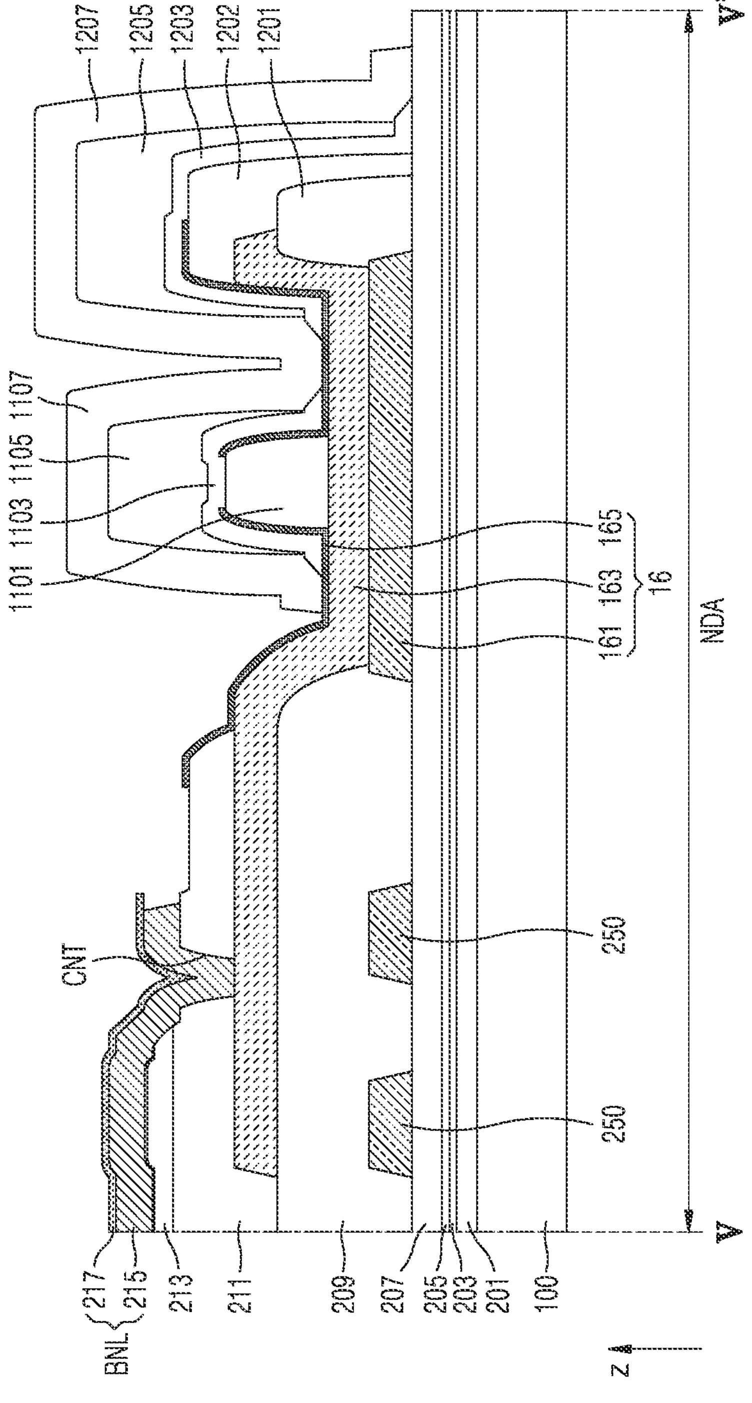

Referring to FIGS. 11A and 11B, a material forming a first intermediate layer 231, a material forming a first opposite electrode 241, a material forming a first capping layer 251, and a first inorganic encapsulation layer 311 may be sequentially stacked on each other on the structure described with reference to FIG. 10A.

The material forming the first intermediate layer 231 may be deposited on the entire surface of the display area DA and separated into the first intermediate layer 231 and a first dummy intermediate layer 231P by a tip of the second sub-metal layer 217, the first intermediate layer 231 and the first dummy intermediate layer 231P being apart from each other. Similarly, the material forming the first opposite electrode 241 may be separated into the first opposite electrode 241 and a first dummy opposite electrode 241P by the tip of the second sub-metal layer 217, the first opposite electrode 241 and the first dummy opposite electrode 241P being apart from each other. The material forming the first capping layer 251 may be separated into the first capping layer 251 and a first dummy capping layer 251P by a tip of the second interlayer insulating layer 207, the first capping layer 251 and the first dummy capping layer 251P being apart from each other.

A first light-emitting diode ED1 may include the first pixel electrode 221, the first intermediate layer 231, and the first opposite electrode 241. A first dummy layer DM1 including the first dummy intermediate layer 231P, the first dummy opposite electrode 241P, and the first dummy capping layer 251P may be located on the second sub-metal layer 217.

The first inorganic encapsulation layer 311 may be deposited on the entire surface of the display area DA to cover the first light-emitting diode ED1 and the first dummy layer DM1. Thereafter, portions of the first inorganic encapsulation layer 311 other than a portion corresponding to the first light-emitting diode ED1 may be removed. A portion of the first dummy layer DM1 may also be removed. A width of the first dummy layer DM1 remaining adjacent to the first light-emitting diode ED1 may be about 1.5 μm to about 4 μm.

In the non-display area NDA, a first-first inorganic layer 1107 may be formed to cover the first-second organic layer 1105, and a second-first inorganic layer 1207 may be formed to cover the second-third organic layer 1205. The first-first inorganic layer 1107 and the second-first inorganic layer 1207 may be simultaneously formed through the same deposition process as the first inorganic encapsulation layer 311.

Figure 12B:
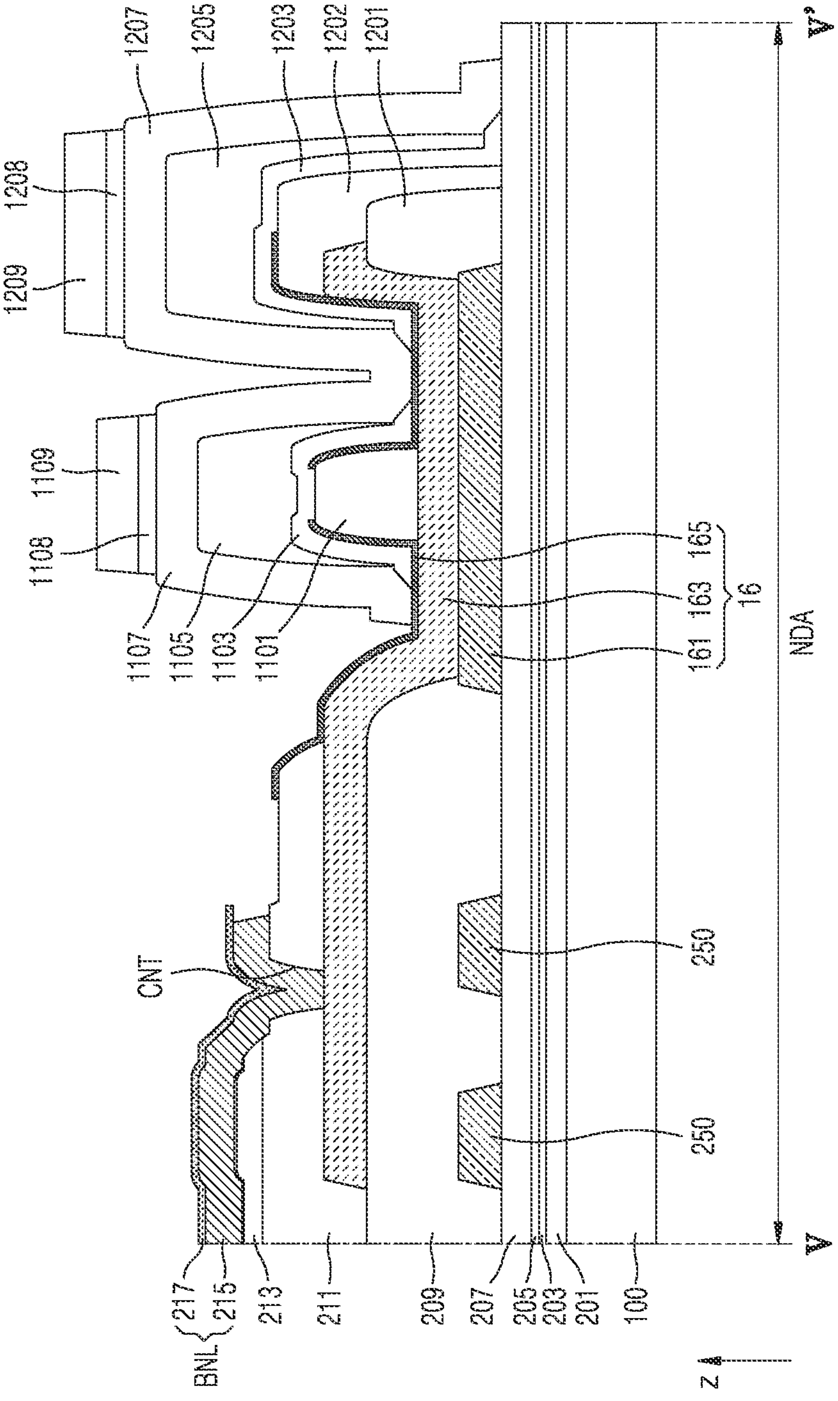

Referring to FIGS. 12A and 12B, a first clad layer 312 covering an end of the first dummy layer DM1 may be formed on the structure described with reference to FIG. 11A, and a second light-emitting diode ED2 may be formed through a process similar to the process of forming the first light-emitting diode ED1.

First, the first clad layer 312 may be formed on the entire surface of the display area DA, and a second pixel opening OP2 may be formed to expose a central portion of the second pixel electrode 223. The second pixel opening OP2 may be formed by etching a portion of the first clad layer 312, a portion of the metal bank layer BNL, and a portion of the inorganic bank layer 213. The second sub-metal layer 217 may form a tip extending toward the center of the second pixel opening OP2. In the process of etching the first sub-metal layer 215 to form the tip of the second sub-metal layer 217, a portion of a sacrificial layer covering the second pixel electrode 223 may be removed, and thus, a residual sacrificial layer 212 covering an edge of the second pixel electrode 223 may be formed.

Thereafter, a material for forming a second intermediate layer 233, a material for forming a second opposite electrode 243, a material for forming a second capping layer 253, and a second inorganic encapsulation material 313 may be sequentially stacked on each other on the entire surface of the display area DA.

The material forming the second intermediate layer 233 may be separated into the second intermediate layer 233 and a second dummy intermediate layer 233P by the tip of the second sub-metal layer 217, the second intermediate layer 233 and the second dummy intermediate layer 233P being apart from each other. The material forming the second opposite electrode 243 may be separated into the second opposite electrode 243 and a second dummy opposite electrode 243P by the tip of the second sub-metal layer 217, the second opposite electrode 243 and the second dummy opposite electrode 243P being apart from each other. The material forming the second capping layer 253 may be separated into the second capping layer 253 and a second dummy capping layer 253P by the tip of the second sub-metal layer 217, the second capping layer 253 and the second dummy capping layer 253P being apart from each other.

The second light-emitting diode ED2 may include the second pixel electrode 223, the second intermediate layer 233, and the second opposite electrode 243. A second dummy layer DM2 including the second dummy intermediate layer 233P, the second dummy opposite electrode 243P, and the second dummy capping layer 253P may be located on the first clad layer 312.

The second inorganic encapsulation layer 313 may be deposited on the entire surface of the display area DA. Thereafter, portions of the second inorganic encapsulation layer 313 other than a portion corresponding to the second light-emitting diode ED2 may be removed. A portion of the second dummy layer DM2 and a portion of the first clad layer 312 may be removed together. Accordingly, a portion 312P of the first clad layer 312 may remain between the second dummy layer DM2 and the second sub-metal layer 217. The remaining portion of the second dummy layer DM2 may have a width of about 1.5 μm to about 4 μm.

In the non-display area NDA, a first-second inorganic layer 1108 and a first-third inorganic layer 1109 may be formed on the first-first inorganic layer 1107, and a second-second inorganic layer 1208 and a second-third inorganic layer 1209 may be formed on the second-first inorganic layer 1207. The first-second inorganic layer 1108 and the second-second inorganic layer 1208 may be simultaneously formed through the same deposition process as the first clad layer 312. The first-third inorganic layer 1109 and the second-third inorganic layer 1209 may be simultaneously formed through the same deposition process as the second inorganic encapsulation layer 313.

A portion of the first-second inorganic layer 1108 and a portion of the first-third inorganic layer 1109 may be etched at the same time, in an etching process of removing portions of the second inorganic encapsulation layer 313 other than a portion adjacent to the second light-emitting diode ED2, so that the first-second inorganic layer 1108 and the first-third inorganic layer 1109 are located only on the upper surface of the first-first inorganic layer 1107. Similarly, a portion of the second-second inorganic layer 1208 and a portion of the second-third inorganic layer 1209 may be etched at the same time, in an etching process of removing portions of the second inorganic encapsulation layer 313 other than a portion adjacent to the second light-emitting diode ED2, so that the second-second inorganic layer 1208 and the second-third inorganic layer 1209 are located only on the upper surface of the second-first inorganic layer 1207.

Referring to FIGS. 13A and 13B, a second clad layer 314 covering an end of the second dummy layer DM2 may be formed on the structure described with reference to FIG. 12A, and a third light-emitting diode ED3 may be formed through a process similar to the process of forming the first light-emitting diode ED1 and the second light-emitting diode ED2.

First, the second clad layer 314 may be formed on the entire surface of the display area DA, and a third pixel opening OP3 may be formed to expose a central portion of the third pixel electrode 225. The third pixel opening OP3 may be formed by etching a portion of the second clad layer 314, a portion of the metal bank layer BNL, and a portion of the inorganic bank layer 213. The second sub-metal layer 217 may form a tip extending toward the center of the third pixel opening OP3. In the process of etching the first sub-metal layer 215 to form the tip of the second sub-metal layer 217, a portion of a sacrificial layer covering the third pixel electrode 225 may be removed, and thus, a residual sacrificial layer 212 covering an edge of the third pixel electrode 225 may be formed.

Thereafter, a material for forming a third intermediate layer 235, a material for forming a third opposite electrode 245, a material for forming a third capping layer 255, and a third inorganic encapsulation material 315 may be sequentially stacked on each other on the entire surface of the display area DA.

The material forming the third intermediate layer 235 may be separated into the third intermediate layer 235 and a third dummy intermediate layer 235P by the tip of the second sub-metal layer 217, the third intermediate layer 235 and the third dummy intermediate layer 235P being apart from each other. The material forming the third opposite electrode 245 may be separated into the third opposite electrode 245 and a third dummy opposite electrode 245P by the tip of the second sub-metal layer 217, the third opposite electrode 245 and the third dummy opposite electrode 245P being apart from each other. The material forming the third capping layer 255 may be separated into the third capping layer 255 and a third dummy capping layer 255P by the tip of the second sub-metal layer 217, the third capping layer 255 and the third dummy capping layer 255P being apart from each other.

The third light-emitting diode ED3 includes the third pixel electrode 225, the third intermediate layer 235, and the third opposite electrode 245. A third dummy layer DM3 including the third dummy intermediate layer 235P, the third dummy opposite electrode 245P, and the third dummy capping layer 255P may be located on the second clad layer 314.

The third inorganic encapsulation layer 315 may be deposited on the entire surface of the display area DA. Thereafter, portions of the third inorganic encapsulation layer 315 other than a portion corresponding to the third light-emitting diode ED3 may be removed. A portion of the third dummy layer DM3 and a portion of the second clad layer 314 may be removed together. Accordingly, a portion 314P of the second clad layer 314 may remain between the third dummy layer DM3 and the second sub-metal layer 217. The remaining portion of the third dummy layer DM3 may have a width of about 1.5 μm to about 4 μm.

In the non-display area NDA, a first-fourth inorganic layer 1110 and a first-fifth inorganic layer 1111 may be formed on the first-third inorganic layer 1109, and a second-fourth inorganic layer 1210 and a second-fifth inorganic layer 1211 may be formed on the second-third inorganic layer 1209. The first-fourth inorganic layer 1110 and the second-fourth inorganic layer 1210 may be simultaneously formed through the same deposition process as the second clad layer 314. The first-fifth inorganic layer 1111 and the second-sixth inorganic layer 1212 may be simultaneously formed through the same deposition process as the third inorganic encapsulation layer 315.

A portion of the first-fourth inorganic layer 1110 and a portion of the first-fifth inorganic layer 1111 may be etched at the same time, in an etching process of removing portions of the third inorganic encapsulation layer 315 other than a portion adjacent to the third light-emitting diode ED3, so that the first-fourth inorganic layer 1110 and the first-fifth inorganic layer 1111 are located only on the upper surface of the first-third inorganic layer 1109. Similarly, a portion of the second-fourth inorganic layer 1210 and a portion of the second-fifth inorganic layer 1211 may be etched at the same time, in an etching process of removing portions of the third inorganic encapsulation layer 315 other than a portion adjacent to the third light-emitting diode ED3, so that the second-fourth inorganic layer 1210 and the second-fifth inorganic layer 1211 are located only on the upper surface of the second-third inorganic layer 1209.

Figure 14A:
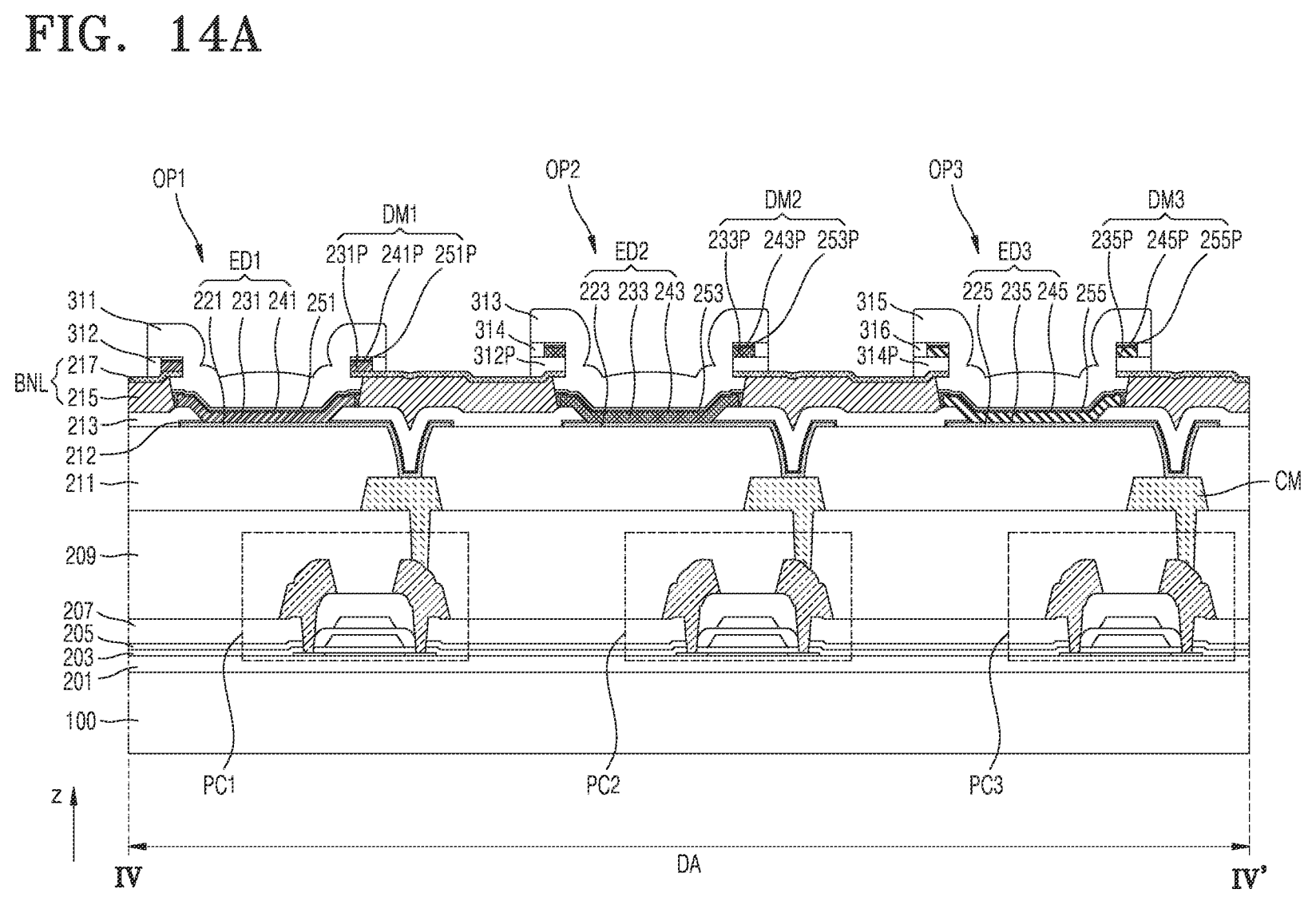
Figure 14B:
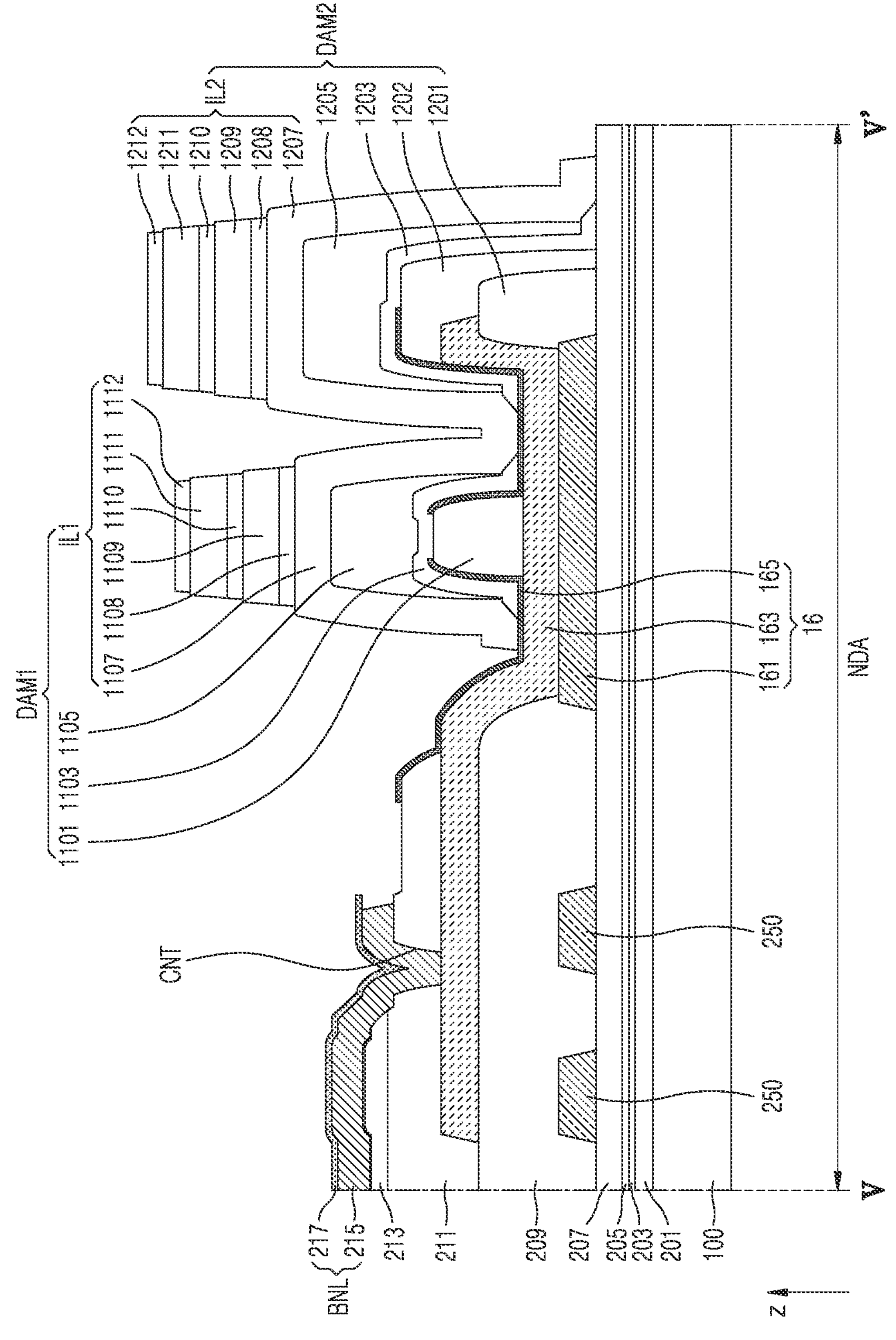

Referring to FIGS. 14A and 14B, a third clad layer 316 covering an end of the third dummy layer DM3 may be formed on the structure described with reference to FIG. 13A.

In the non-display area NDA, a first-sixth inorganic layer 1112 may be formed on the first-fifth inorganic layer 1111, and a second-sixth inorganic layer 1212 may be formed on the second-fifth inorganic layer 1211. The first-sixth inorganic layer 1112 and second-sixth inorganic layer 1212 may be simultaneously formed through the same deposition process as the third clad layer 316.

In an etching process of removing portions of the third clad layer 316 other than a portion covering an end of the third dummy layer DM3, a portion of the first-sixth inorganic layer 1112 and a portion of the second-sixth inorganic layer 1212 may be simultaneously etched to form a first dam DAM1 and a second dam DAM2.

The first dam DAM1 and the second dam DAM2 may have sufficient heights without an additional process other than the deposition and etching processes for the first inorganic encapsulation layer 311, the second inorganic encapsulation layer 313, and the third inorganic encapsulation layer 315 covering the first light-emitting diode ED1, the second light-emitting diode ED2, and the third light-emitting diode ED3, respectively.

Figure 15:
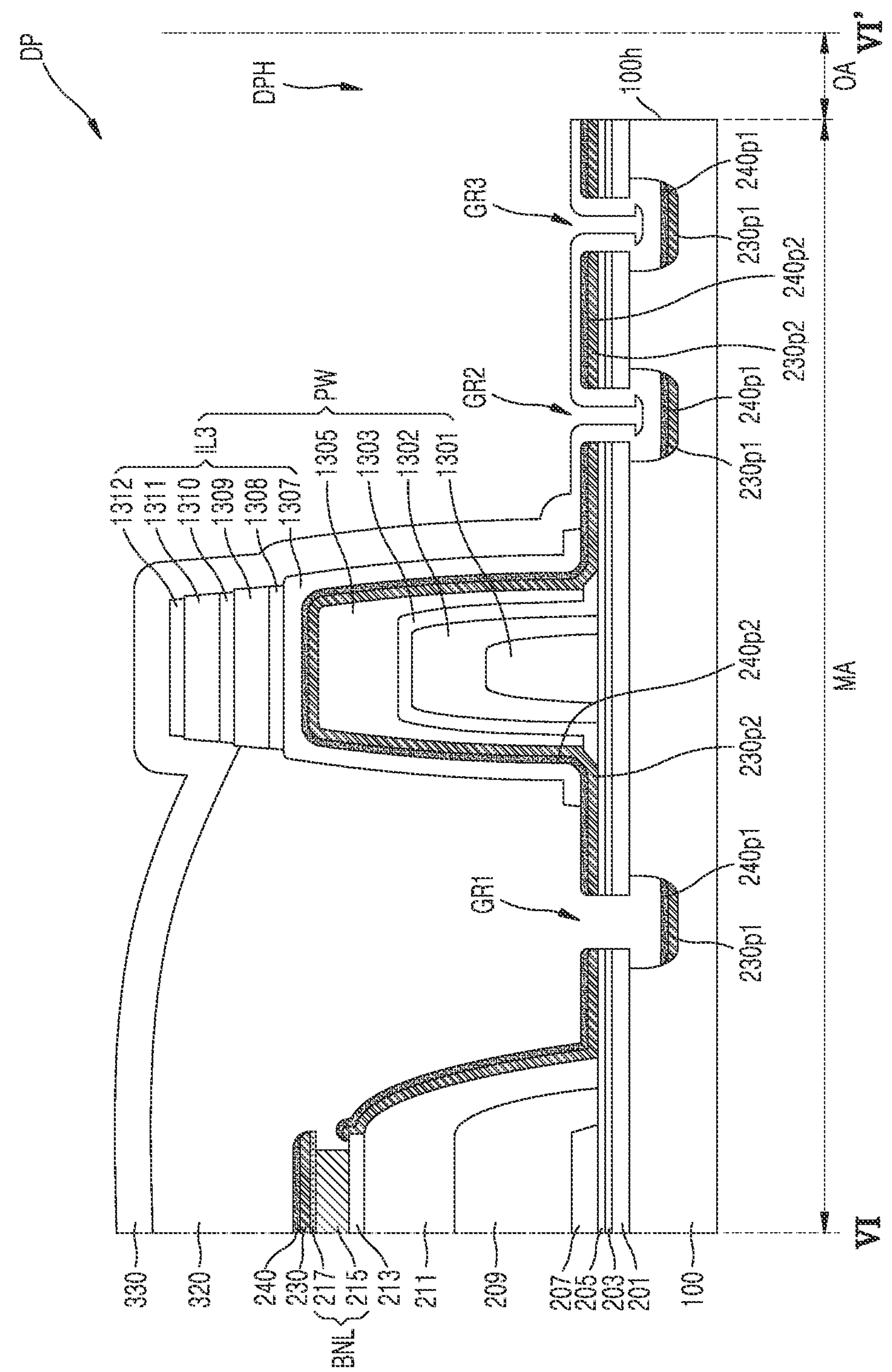
Figure 17:
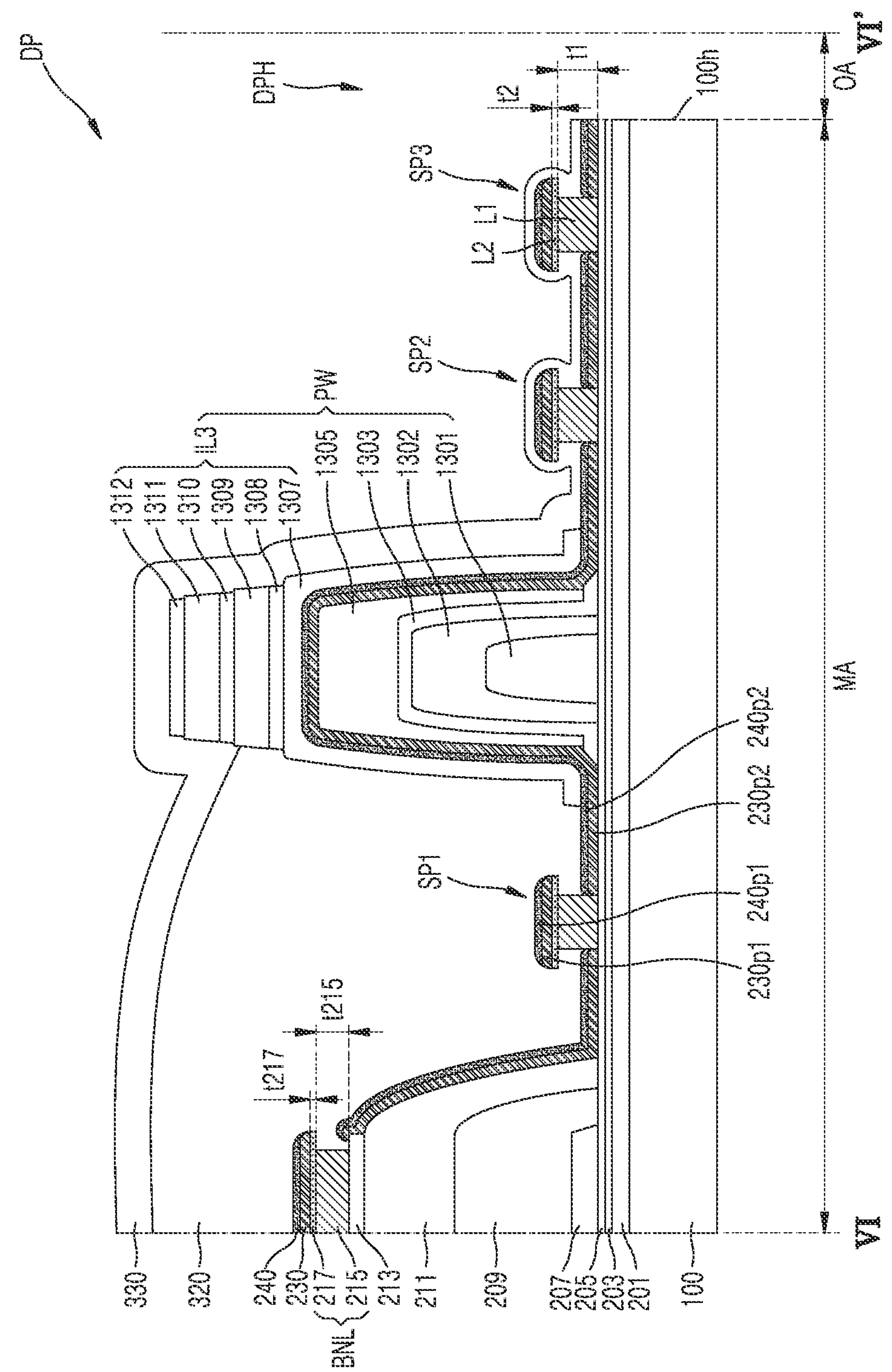

FIGS. 15 to 17 are schematic cross-sectional views of a portion of a display panel DP according to embodiments. FIGS. 15 to 17 show cross-sections of the display panel DP, taken along line VI-VI' shown in FIG. 5.

Referring to FIG. 15, a buffer layer 201, a first gate insulating layer 203, and a first interlayer insulating layer 205 may be formed on a middle area MA of a substrate 100 and extend toward a through hole 100H of the substrate 100. In other words, boundaries of the buffer layer 201, the first gate insulating layer 203, and the first interlayer insulating layer 205, which face an opening area OA, may be located on substantially the same vertical line as a boundary of the substrate 100 defining the through hole 100H.

A boundary of a first planarization layer 209 and a boundary of a second planarization layer 211 may be located in the middle area MA. For example, the boundary of the first planarization layer 209 and the boundary of the second planarization layer 211 may be located between a display area DA (see FIG. 5) and a first groove GR1 disposed closest to the display area DA from among grooves GR1, GR2, and GR3 disposed in the middle area MA.

FIG. 15 shows that a boundary of a second interlayer insulating layer 207 and a boundary of an inorganic bank layer 213 are farther from the opening area OA than the boundary of the second planarization layer 211. However, in some embodiments, the second interlayer insulating layer 207 and/or the inorganic bank layer 213 may extend toward the through hole 100H of the substrate 100.

At least one barrier rib PW surrounding the opening area OA may be disposed on the middle area MA. The barrier rib PW may include a first organic barrier layer 1301, a second organic barrier layer 1302, a lower inorganic barrier layer 1303, a third organic barrier layer 1305, and a third inorganic stack IL3, but is not limited thereto. The barrier rib PW may further include one or more organic layers, one or more inorganic layers, and/or one or more metal layers. In another embodiment, some of the layers constituting the barrier rib PW may be omitted. For example, the barrier rib PW may have a structure similar to a layer constituting the second dam DAM2 described with reference to FIGS. 9A to 9E.

The first organic barrier layer 1301 may include an organic insulating material. The organic insulating material may include acrylic, BCB, polyimide, HMDSO, and/or the like. In another embodiment, the first organic barrier layer 1301 may include an inorganic insulating material. The inorganic insulating material may include silicon oxide, silicon nitride, and/or silicon oxynitride. In an embodiment, the first organic barrier layer 1301 may include the same material as the first planarization layer 209.

The second organic barrier layer 1302 may be disposed on the first organic barrier layer 1301 to cover the first organic barrier layer 1301. The second organic barrier layer 1302 may include an organic insulating material. The organic insulating material may include acrylic, BCB, polyimide, HMDSO, and/or the like. In an embodiment, the second organic barrier layer 1302 may include the same material as the second planarization layer 211.

The lower inorganic barrier layer 1303 may be disposed on the second organic barrier layer 1302 to cover the second organic barrier layer 1302. The lower inorganic barrier layer 1303 may include an inorganic insulating material, such as silicon oxide, silicon nitride, or silicon oxynitride, and may have a single-layered or multi-layered structure including the aforementioned inorganic insulating material. In an embodiment, the lower inorganic barrier layer 1303 may include the same material as the inorganic bank layer 213.

The third organic barrier layer 1305 may be disposed on the lower inorganic barrier layer 1303. The third organic barrier layer 1305 may include an organic insulating material. The organic insulating material may include acrylic, BCB, polyimide, HMDSO, and/or the like. In some embodiments, similar to the structure of the second dam DAM2 described with reference to FIG. 9C, the third organic barrier layer 1305 of the barrier rib PW may also be omitted.

The third inorganic barrier stack IL3 may be disposed on the lower inorganic barrier layer 1303 or the third organic barrier layer 1305, and may include a first inorganic barrier layer 1307, a second inorganic barrier layer 1308, a third inorganic barrier layer 1309, a fourth inorganic barrier layer 1310, a fifth inorganic barrier layer 1311, and a sixth inorganic barrier layer 1312.

The first inorganic barrier layer 1307, the third inorganic barrier layer 1309, and the fifth inorganic barrier layer 1311 may include silicon nitride or silicon oxynitride. The first inorganic barrier layer 1307 may include the same material as the first inorganic encapsulation layer 311 (see FIG. 7A). The third inorganic barrier layer 1309 may include the same material as the second inorganic encapsulation layer 313 (see FIG. 7A). The fifth inorganic barrier layer 1311 may include the same material as the third inorganic encapsulation layer 315 (see FIG. 7A). For example, the first inorganic barrier layer 1307 may be formed simultaneously with the first inorganic encapsulation layer 311 in the process of forming the first inorganic encapsulation layer 311, and the third inorganic barrier layer 1309 may be formed simultaneously with the second inorganic encapsulation layer 313 in the process of forming the second inorganic encapsulation layer 313. The fifth inorganic barrier layer 1311 may be formed simultaneously with the third inorganic encapsulation layer 315 in the process of forming the third inorganic encapsulation layer 315.

The second inorganic barrier layer 1308, the fourth inorganic barrier layer 1310, and the sixth inorganic barrier layer 1312 may include silicon nitride. The second inorganic barrier layer 1308 may include the same material as the first clad layer 312 (see FIG. 7A). The fourth inorganic barrier layer 1310 may include the same material as the second clad layer 314 (see FIG. 7A). The sixth inorganic barrier layer 1312 may include the same material as the third clad layer 316 (see FIG. 7A). For example, the second inorganic barrier layer 1308 may be formed simultaneously with the first clad layer 312 in the process of forming the first clad layer 312, and the fourth inorganic barrier layer 1310 may be formed simultaneously with the second clad layer 314 in the process of forming the second clad layer 314. The sixth inorganic barrier layer 1312 may be formed simultaneously with the third clad layer 316 in the process of forming the third clad layer 316.

In some embodiments, similar to the structure of the second dam DAM2 described with reference to FIG. 9B, some of the inorganic barrier layers constituting the third inorganic stack IL3 of the barrier rib PW may be omitted. In some other embodiments, similar to the structure of the second dam DAM2 described with reference to FIGS. 9D and 9E, the barrier rib PW may further include a metal barrier layer positioned on the lower inorganic barrier layer 1303. The metal barrier layer may include the same material as the metal bank layer BNL.

An end of the organic encapsulation layer 320 may be located on the side surface or the upper surface of the barrier rib PW. The fourth inorganic encapsulation layer 330 may pass by an end of the organic encapsulation layer 320 and directly contact the third inorganic stack IL3 to form an inorganic contact region.

A first groove GR1 may be located between the barrier rib PW and the display area DA. In the specification, a groove may refer to a region in which a portion of the substrate 100 is removed in a downward direction (−z direction) and a portion thereof remains. For example, an opening passing through the buffer layer 201, the first gate insulating layer 203, and the first interlayer insulating layer 205 and a recess formed by removing a portion of the substrate 100 form the first groove GR1. A portion of the substrate 100 positioned below the buffer layer 201 may be removed, and thus, the first groove GR1 may have an undercut cross-section. In other words, the side surface of the buffer layer 201 may form a tip protruding more towards the center of the first groove GR1 than the side surface of the substrate 100 defining the first groove GR1.

A second groove GR2 and a third groove GR3 may be disposed between the barrier rib PW and the opening area OA. The structure of the second groove GR2 and the structure of the third groove GR3 may be substantially the same as or similar to that of the first groove GR1.

An organic material layer 230 and an opposite electrode layer 240 may be disposed on the metal bank layer BNL. The organic layer 230 may include the same material as at least one of the first intermediate layer 231 (see FIG. 7A), the second intermediate layer 233 (see FIG. 7A), and the third intermediate layer 235 (see FIG. 7A). In this regard, FIG. 15 shows a case in which the organic material layer 230 includes the same material as the first intermediate layer 231.

The opposite electrode layer 240 may include the same material as at least one of the first opposite electrode 241 (see FIG. 7A), the second opposite electrode 243 (see FIG. 7A), and the third opposite electrode 245 (see FIG. 7A). In this regard, FIG. 15 shows a case in which the opposite electrode layer 240 includes the same material as the first opposite electrode 241. A capping layer (not shown) may be disposed on the opposite electrode layer 240.

In some embodiments, the organic material layer 230 and the opposite electrode layer 240 may not be disposed in the middle area MA.

Because the first groove GR1 has an undercut structure, the organic layer 230 may be separated into a first portion **230*p*1 inside the first groove GR1 and a second portion 230*p*2 outside the first groove GR1, the first portion 230*p*1 and the second portion 230*p*2 being apart from each other. Similarly, the opposite electrode layer 240 may be separated into a first portion 240*p*1 inside the first groove GR1 and a second portion 240*p*2 outside the first groove GR1, the first portion 240*p*1 and the second portion 240*p*2** being apart from each other.

The fourth inorganic encapsulation layer 330 may have relatively better step coverage than the organic material layer 230 and the opposite electrode layer 240. Accordingly, the fourth inorganic encapsulation layer 330 may be continuously formed without being disconnected from the second groove GR2 and the third groove GR3. The fourth inorganic encapsulation layer 330 may continuously cover inner surfaces of the second and third grooves GR2 and GR3.

The grooves GR1, GR2, and GR3 may reduce a path, through which impurities penetrate from the through hole 100H of the substrate 100 along the organic layer 230, and prevent the fourth inorganic encapsulation layer 330 from being lifted.

FIG. 16 is similar to FIG. 15, but may be different from FIG. 15 at least in that the opposite electrode layer 240 may be located only in a region overlapping the second planarization layer 211 and openings h1, h2, and h3 disconnecting the organic material layer 230 may be disposed instead of the first to third grooves GR1, GR2, and GR3. The openings h1, h2, and h3 of the organic layer 230 may be formed through a laser lift-off process using a sacrificial layer. The aforementioned sacrificial layer may be covered with at least one insulating layer, and a through hole formed in at least one insulating layer may be placed under the openings h1, h2, and h3 of the organic layer 230 formed through the laser lift-off process.

In the opening h2 and the opening h3 of the organic material layer 230 disposed outside the barrier rib PW, the fourth inorganic encapsulation layer 330 may directly contact an inorganic insulating layer below the fourth inorganic encapsulation layer 330. The openings h1, h2, and h3 of the organic layer 230 may reduce a path through which impurities penetrate from the through hole 100H of the substrate 100 along the organic layer 230.

FIG. 17 is similar to FIG. 15, but may be different from FIG. 15 at least in that separators SP1, SP2, and SP3 may be disposed instead of the grooves GR1, GR2, and GR3.

Each of the separators SP1, SP2, and SP3 may include a first layer L1 and a second layer L2 positioned on the first layer L1. Each of the first layer L1 and the second layer L2 may include a conductive material. The first layer L1 may include a conductive material that is different from that included in the second layer L2.

In some embodiments, the first layer L1 may include a metal. For example, the first layer L1 may include at least one selected from copper, aluminum, platinum, palladium, silver, magnesium, gold, nickel, neodymium, iridium, chromium, lithium, calcium, and molybdenum.

The second layer L2 may include a metal and/or a transparent conductive oxide. For example, the second layer L2 may include at least one selected from titanium, molybdenum, tantalum, and tungsten. In another embodiment, the second layer L2 may include a transparent conductive oxide, such as indium tin oxide (ITO).

The second layer L2 may have tips protruding outward from the upper surface of the first layer L1. The organic layer 230 may be separated, by a tip of the second layer L2, into a first portion 230*p*1 positioned on the second layer L2 of each of the separators SP1, SP2, and SP3 and a second portion 230*p*2 other than the first portion 230*p*1, the first portion 230*p*1 and the second portion 230*p*2 being apart from each other. Similarly, the opposite electrode layer 240 may be separated into a first portion 240*p*1 positioned on the second layer L2 of each of the separators SP1, SP2, and SP3 and a second portion 240*p*2 other than the first portion 240*p*1.

In some embodiments, the separators SP1, SP2, and SP3 may be produced together in the same process as at least one of a source electrode SE (see FIG. 7A), a drain electrode DE (see FIG. 7A), a connection electrode CM (see FIG. 7A), and the metal bank layer BNL.

In an embodiment, the first layer L1 of each of the separators SP1, SP2, and SP3 may include the same material as the first sub-metal layer 215 of the metal bank layer BNL. The second layer L2 of each of the separators SP1, SP2, and SP3 may include the same material as the second sub-metal layer 217 of the metal bank layer BNL. In other words, a thickness t215 of the first sub-metal layer 215 may be equal to a thickness t1 of the first layer L1, and a thickness t217 of the second sub-metal layer 217 may be equal to a thickness t2 of the second layer L2. For example, the first layer L1 may include aluminum, and the second layer L2 may include titanium. In an embodiment, the thickness t1 of the first layer L1 may be about 6,000 Å, and the thickness t2 of the second layer L2 may be about 1,000 Å.

In another embodiment, the separators SP1, SP2, and SP3 may include the same material as the connection electrode CM. For example, in case that each of the separators SP1, SP2, and SP3 includes the first layer L1 and the second layer L2 including different metals, the connection electrode CM may also have a double layer structure including different metals. For example, the connection electrode CM may have a double layer structure including Al/Ti layers, the first layer L1 may include aluminum, and the second layer L2 may include titanium. The thickness t1 of the first layer L1 may be about 300 Å, and the thickness t2 of the second layer L2 may be about 600 Å.

Although not shown in FIG. 17, at least some of the separators SP1, SP2, and SP3 may be disposed on single-layered or multi-layered organic patterns. For example, the organic patterns may be apart from each other and may be disposed to surround the opening area OA when viewed in a direction perpendicular to the substrate 100. The separators SP1, SP2, and SP3 may be disposed on upper surfaces of the organic patterns. In some embodiments, the organic patterns may include the same material as the first planarization layer 209 and/or the second planarization layer 211.

In an embodiment, an inorganic pattern may be disposed between the organic patterns and the separators SP1, SP2, and SP3. The inorganic pattern may include the same material as the inorganic bank layer 213.

The separators SP1, SP2, and SP3 may reduce a path, through which impurities penetrate from the through hole 100H of the substrate 100 along the organic layer 230, and prevent the fourth inorganic encapsulation layer 330 from being lifted.

According to one or more embodiments of the disclosure made as described above, a display panel with improved reliability may be implemented by reducing the permeation of oxygen or moisture from the outside. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display panel, comprising:
a display area;
a non-display area disposed outside the display area;
first to third light-emitting diodes disposed on a substrate in the display area and emitting light in different colors, the first to third light-emitting diodes each including:
a pixel electrode;
an opposite electrode disposed to correspond to the pixel electrode; and
an intermediate layer disposed between the pixel electrode and the opposite electrode;
a metal bank layer disposed in the display area and having pixel openings corresponding to the pixel electrode of the first light-emitting diode, the pixel electrode of the second light-emitting diode, and the pixel electrode of the third light-emitting diode;
a first inorganic encapsulation layer disposed on the first light-emitting diode;
a first dummy layer disposed between the first inorganic encapsulation layer and the metal bank layer;
a first clad layer overlapping an end of the first dummy layer; and
a dam disposed in the non-display area to surround at least a portion of the display area and including:
a first inorganic layer; and
a second inorganic layer on the first inorganic layer, wherein
the first inorganic layer and the first inorganic encapsulation layer include a same material, and
the second inorganic layer and the first clad layer include a same material.

2. The display panel of claim 1, wherein
the metal bank layer includes a first sub-metal layer and a second sub-metal layer that are disposed on the first sub-metal layer, and
the second sub-metal layer has tips each extending from an upper surface of the first sub-metal layer toward a center of each of the pixel openings.

3. The display panel of claim 1, wherein the second inorganic layer is disposed to correspond to an upper surface of the first inorganic layer.

4. The display panel of claim 1, further comprising:
an inorganic bank layer disposed below the metal bank layer and having openings corresponding to the pixel electrode of the first light-emitting diode, the pixel electrode of the second light-emitting diode, and the pixel electrode of the third light-emitting diode, wherein
the dam further includes a lower inorganic layer disposed below the first inorganic layer, and
the lower inorganic layer and the inorganic bank layer include a same material.

5. The display panel of claim 1, wherein
the dam further includes a metal layer disposed below the first inorganic layer, and
the metal layer and the metal bank layer include a same material.

6. The display panel of claim 1, further comprising:
a second inorganic encapsulation layer disposed on the second light-emitting diode;
a second dummy layer disposed between the second inorganic encapsulation layer and the metal bank layer; and
a second clad layer overlapping an end of the second dummy layer, wherein
the dam further includes a third inorganic layer and a fourth inorganic layer sequentially stacked on each other on the second inorganic layer,
the third inorganic layer and the second inorganic encapsulation layer include a same material, and
the fourth inorganic layer and the second clad layer include a same material.

7. The display panel of claim 1, further comprising:
an organic encapsulation layer disposed on the first inorganic encapsulation layer, wherein
the dam includes a first dam and a second dam apart from the first dam and disposed outside the first dam, and
the end of the organic encapsulation layer is disposed on a side surface or an upper surface of the first dam.

8. The display panel of claim 2, wherein each of the opposite electrode of the first light-emitting diode, the opposite electrode of the second light-emitting diode, and the opposite electrode of the third light-emitting diode directly contacts the second sub-metal layer.

9. The display panel of claim 4, wherein the dam further includes an organic layer disposed between the lower inorganic layer and the first inorganic layer.

10. The display panel of claim 4, wherein the first inorganic layer directly contacts the lower inorganic layer.

11. The display panel of claim 6, further comprising:
a third inorganic encapsulation layer disposed on the third light-emitting diode;
a third dummy layer disposed between the third inorganic encapsulation layer and the metal bank layer; and
a third clad layer overlapping an end of the third dummy layer, wherein
the dam further includes a fifth inorganic layer and a sixth inorganic layer sequentially stacked on each other on the fourth inorganic layer,
the fifth inorganic layer and the third inorganic encapsulation layer include a same material, and
the sixth inorganic layer and the third clad layer include a same material.

12. The display panel of claim 7, further comprising:
a common voltage supply line disposed on the non-display area and surrounding at least a portion of the display area,
wherein the metal bank layer directly contacts the common voltage supply line.

13. The display panel of claim 12, wherein an outer end of the common voltage supply line and the second dam overlap each other.

14. A display panel, comprising:
an opening area;
a display area surrounding the opening area;
a middle area disposed between the opening area and the display area;
first to third light-emitting diodes disposed on a substrate in the display area and emitting light in different colors, the first to third light-emitting diodes each including:
a pixel electrode;
an opposite electrode disposed to correspond to the pixel electrode; and
an intermediate layer disposed between the pixel electrode and the opposite electrode;
a metal bank layer disposed in the display area and having pixel openings corresponding to the pixel electrode of the first light-emitting diode, the pixel electrode of the second light-emitting diode, and the pixel electrode of the third light-emitting diode;
a first inorganic encapsulation layer disposed on the first light-emitting diode;

a first dummy layer disposed between the first inorganic encapsulation layer and the metal bank layer;

a first clad layer overlapping an end of the first dummy layer; and a barrier rib disposed on the middle area to surround the opening area and including:

a first inorganic barrier layer; and a second inorganic barrier layer on the first inorganic barrier layer, wherein the first inorganic barrier layer and the first inorganic encapsulation layer include a same material, and the second inorganic barrier layer and the first clad layer include a same material.

15. The display panel of claim 14, further comprising:

an inorganic bank layer disposed below the metal bank layer and having openings corresponding to the pixel electrode of the first light-emitting diode, the pixel electrode of the second light-emitting diode, and the pixel electrode of the third light-emitting diode, wherein the barrier rib further includes a lower inorganic barrier layer disposed below the first inorganic barrier layer, and the lower inorganic barrier layer and the inorganic bank layer include a same material.

16. The display panel of claim 14, wherein the barrier rib further includes a metal barrier layer disposed below the first inorganic barrier layer, and the metal barrier layer and the metal bank layer include a same material.

17. The display panel of claim 14, further comprising:

a second inorganic encapsulation layer disposed on the second light-emitting diode;

a second dummy layer disposed between the second inorganic encapsulation layer and the metal bank layer; and a second clad layer overlapping an end of the second dummy layer, wherein the barrier rib further includes a third inorganic barrier layer and a fourth inorganic barrier layer sequentially stacked on each other on the second inorganic barrier layer, the third inorganic barrier layer and the second inorganic encapsulation layer include a same material, and the fourth inorganic barrier layer and the second clad layer include a same material.

18. The display panel of claim 14, further comprising:

a separator disposed in the middle area and including a first layer and a second layer on the first layer, wherein the second layer has tips extending from an upper surface of the first layer toward the display area and the opening area.

19. The display panel of claim 15, wherein the first inorganic barrier layer directly contacts the lower inorganic barrier layer.

20. The display panel of claim 17, further comprising:

a third inorganic encapsulation layer disposed on the third light-emitting diode;

a third dummy layer disposed between the third inorganic encapsulation layer and the metal bank layer; and a third clad layer overlapping an end of the third dummy layer, wherein the barrier rib further includes a fifth inorganic barrier layer and a sixth inorganic barrier layer sequentially stacked on each other on the fourth inorganic barrier layer, the fifth inorganic barrier layer and the third inorganic encapsulation layer include a same material, and the sixth inorganic barrier layer and the third clad layer include a same material.

21. The display panel of claim 18, wherein the metal bank layer includes a first sub-metal layer and a second sub-metal layer disposed on the first sub-metal layer, and the second sub-metal layer has tips each extending from an upper surface of the first sub-metal layer toward a center of each of the pixel openings.

22. The display panel of claim 21, wherein the first layer of the separator and the first sub-metal layer include a same material, and the second layer of the separator and the second sub-metal layer include a same material.

23. The display panel of claim 21, wherein a thickness of the first layer of the separator is equal to a thickness of the first sub-metal layer, and a thickness of the second layer of the separator is equal to a thickness of the second sub-metal layer.

* * * * *